(12) United States Patent
Ohse et al.

(10) Patent No.: US 11,271,118 B2
(45) Date of Patent: Mar. 8, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Naoyuki Ohse, Matsumoto (JP); Takahito Kojima, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 72 days.

(21) Appl. No.: 16/942,201

(22) Filed: Jul. 29, 2020

(65) Prior Publication Data
US 2021/0074863 A1 Mar. 11, 2021

(30) Foreign Application Priority Data
Sep. 6, 2019 (JP) .............................. JP019-162522

(51) Int. Cl.
*H01L 21/04* (2006.01)
*H01L 29/06* (2006.01)
(Continued)

(52) U.S. Cl.
CPC .......... *H01L 29/872* (2013.01); *H01L 21/046* (2013.01); *H01L 21/0485* (2013.01);
(Continued)

(58) Field of Classification Search
CPC ................ H01L 29/06; H01L 29/0615; H01L 29/0619; H01L 29/0623; H01L 29/0692;
(Continued)

(56) References Cited

U.S. PATENT DOCUMENTS

2008/0277668 A1 11/2008 Okuno et al.
2010/0032730 A1 2/2010 Endo et al.
(Continued)

FOREIGN PATENT DOCUMENTS

JP H01-020616 A 1/1989
JP 2003-158259 A 5/2003
(Continued)

OTHER PUBLICATIONS

Morihiko Kiritani et al., "Single Material Ohmic Contacts Simultaneously Formed on the Source/P-well/Gate of 4H-SiC Vertical MOSFEI s", Materials Science Forum, Switzerland, Trans Tech Publications, 2003, vols. 433-436, pp. 669-672.

*Primary Examiner* — Fazli Erdem
(74) *Attorney, Agent, or Firm* — Rabin & Berdo, P.C.

(57) ABSTRACT

A semiconductor device including a silicon carbide semiconductor substrate having a first-conductivity-type region at its first main surface. The semiconductor device has, at the first main surface, a plurality of first second-conductivity-type regions and a second second-conductivity-type region selectively provided in the first-conductivity-type region, respectively in an active region and a connecting region of the semiconductor device, and an oxide film provided in a termination region of the semiconductor device and having an inner end that faces the active region. A first silicide film is in ohmic contact with the first second-conductivity-type regions. A second silicide film is in contact with the inner end of the oxide film and in ohmic contact with the second second-conductivity-type region. The semiconductor device has a first electrode including a titanium film and a metal electrode film stacked sequentially on the first main surface, and a second electrode provided at a second main surface.

15 Claims, 27 Drawing Sheets

(51) Int. Cl.
  *H01L 29/872* (2006.01)
  *H01L 29/16* (2006.01)
  *H01L 29/66* (2006.01)
  *H01L 21/761* (2006.01)
(52) U.S. Cl.
  CPC ........ *H01L 21/0495* (2013.01); *H01L 21/761* (2013.01); *H01L 29/0623* (2013.01); *H01L 29/1608* (2013.01); *H01L 29/6606* (2013.01)
(58) Field of Classification Search
  CPC ..... H01L 29/16; H01L 29/1608; H01L 29/47; H01L 29/66; H01L 29/6606; H01L 29/87; H01L 29/872; H01L 21/04; H01L 21/046; H01L 21/048; H01L 21/0485; H01L 21/049; H01L 21/0495; H01L 21/76; H01L 21/761
  USPC .......................................................... 257/77
  See application file for complete search history.

(56) References Cited

U.S. PATENT DOCUMENTS

| | | |
|---|---|---|
| 2010/0055858 A1 | 3/2010 | Hayashi et al. |
| 2014/0061674 A1* | 3/2014 | Imai .................... H01L 29/0619 257/77 |
| 2017/0271472 A1 | 9/2017 | Ohse et al. |
| 2018/0158914 A1* | 6/2018 | Kitamura ................ H01L 29/45 |

FOREIGN PATENT DOCUMENTS

| | | |
|---|---|---|
| JP | 2005-276978 A | 10/2005 |
| JP | 2008-282972 A | 11/2008 |
| JP | 4291875 B2 | 7/2009 |
| JP | 5546759 B2 | 7/2014 |
| JP | 2017-175115 A | 9/2017 |

* cited by examiner

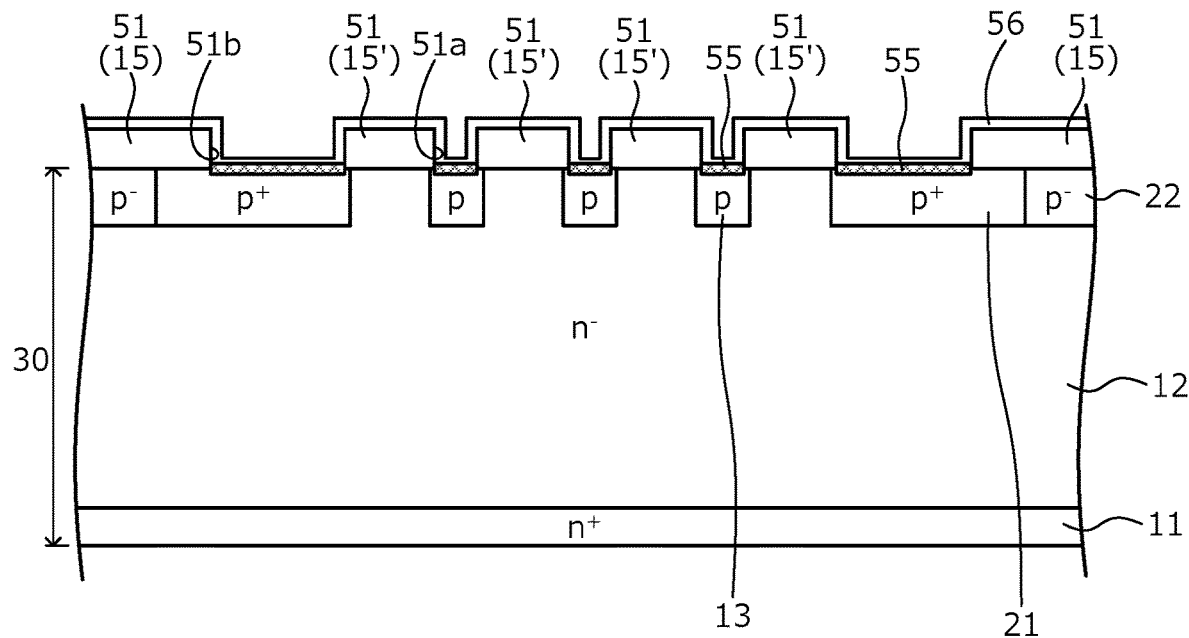
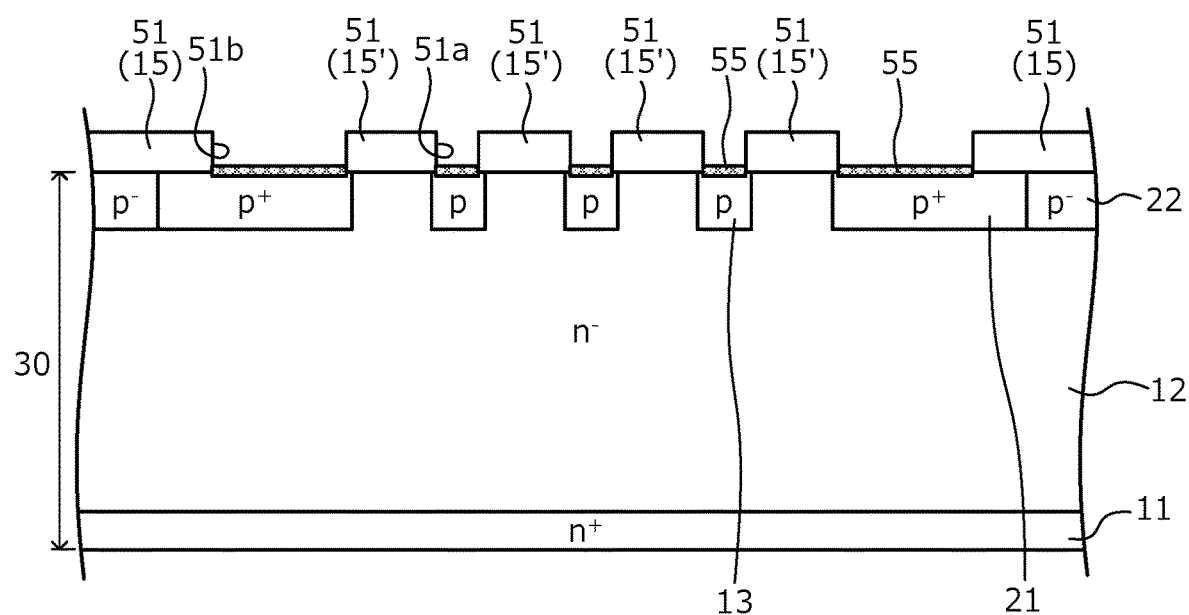

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-162522, filed on Sep. 6, 2019, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) semiconductors have been gaining attention in recent years as a semiconductor material that enables fabrication (manufacture) of semiconductor devices (hereinafter, silicon carbide semiconductor devices) that exceed the limitations of semiconductor devices that use a silicon (Si) semiconductor. In particular, as compared to silicon semiconductors, silicon carbide semiconductors have a large dielectric breakdown field strength and high thermal conductivity and utilizing these characteristics, applications to high voltage (for example, at least 1700V) semiconductor devices is expected.

In a case of a silicon carbide semiconductor device being a diode (hereinafter, silicon carbide diode), design specifications of an n$^-$-type epitaxial layer that configures an n$^-$-type drift region may be set to have a thin thickness and a high impurity concentration and therefore, in general, a silicon carbide diode having a withstand voltage of about 3300V has a structure of a Schottky barrier diode (SBD).

A structure of a silicon carbide diode having a conventional SBD structure will be described. FIG. 32 is a plan view depicting a conventional silicon carbide semiconductor device when viewed from a front side of a semiconductor substrate. A conventional silicon carbide semiconductor device 140 depicted in FIG. 32 is a vertical silicon carbide diode having a SBD structure in which, in an active region 110, a Schottky junction is formed along an entire area of a front surface of a semiconductor substrate 130 containing silicon carbide.

The Schottky junction of the conventional silicon carbide semiconductor device 140 is configured by an n$^-$-type drift region 112 exposed at the front surface of the semiconductor substrate 130 and a front electrode (not depicted) configured by a metal layer provided on the front surface of the semiconductor substrate 130. Reference numerals 120, 121 are an edge termination region and a field limiting ring (FLR), respectively.

Normally, in the SBD structure, at joined surfaces of the semiconductor substrate 130 and the front electrode, electric field strength is high and during application of reverse voltage, a problem of reverse leak current increases that cause tunneling of electrons in a Schottky barrier or reverse leak current increases that cause surface defects particular to silicon carbide occurs. Therefore, a silicon carbide diode has been proposed that adopts a junction barrier Schottky (JBS) structure in which a mixture of a Schottky junction and a pn junction is present at the front side of the semiconductor substrate 130.

A structure of a silicon carbide diode having a conventional JBS structure will be described. FIG. 33 is a plan view depicting an example of a state of another conventional silicon carbide semiconductor device when viewed from a front side of a semiconductor substrate. In FIG. 33, a voltage withstanding structure of an edge termination region, a front electrode 114 and a field oxide film 115 disposed on the front surface of the semiconductor substrate 130 are not depicted. FIG. 34 is a cross-sectional view of the structure along cutting line AA-AA' in in FIG. 33. Reference numeral 119 is back electrode.

A conventional silicon carbide semiconductor device 140' depicted in FIGS. 33, 34 differs from the conventional silicon carbide semiconductor device 140 depicted in FIG. 32 in that in the active region 110, a SBD structure constituted by Schottky junctions between the n$^-$-type drift region 112 and a titanium film 131 that configures the front electrode 114, and a JBS structure constituted by pn junctions between p-type regions 113 and the n$^-$-type drift region 112 are both present at the front side of the semiconductor substrate 130.

The p-type regions 113 are selectively provided at surface regions of the front surface of the semiconductor substrate 130, in the active region 110. Between adjacent p-type regions 113, the n$^-$-type drift region 112 is exposed at the front surface of the semiconductor substrate 130. The pn junctions are formed by the p-type regions 113 and the n$^-$-type drift region 112, at the front surface of the semiconductor substrate 130. The n$^-$-type drift region 112 between adjacent p-type regions 113 forms Schottky junctions with the titanium film 131 that is beneath the front electrode 114 provided on the front surface of the semiconductor substrate 130.

In this manner, the JBS structure includes a mixture of Schottky junctions and pn junctions at joined surfaces of the semiconductor substrate 130 and the front electrode 114, whereby the electric field strength at the joined surfaces of the semiconductor substrate 130 and the front electrode 114 may be reduced, thereby enabling suppression to about equal to reverse leak current of a free wheeling diode (FWD) that uses a silicon semiconductor. In FIG. 33, the p-type regions 113 that each has a shape of a stripe extending along a direction parallel to the front surface of the semiconductor substrate 130 are indicated by hatching.

In the conventional silicon carbide semiconductor device 140 depicted in FIG. 32, when surge voltage is applied, surge current is generated in the semiconductor substrate 130 and flows in a forward direction, and an amount (hereinafter, pulled amount) of the surge current that is pulled out from inside the semiconductor substrate 130 to the front electrode 114 is small. A reason for this is that a diode having a SBD structure is a unipolar device that does not use minority carriers for electrical conduction and therefore, in high current regions having high forward current that flows through the diode, a contact (electrical contact) between the semiconductor substrate 130 and the front electrode 114 has high resistance.

When the contact between the semiconductor substrate 130 and the front electrode 114 has high resistance and high surge current in the forward direction flows in the semiconductor substrate, the surge current concentrates locally due to heat generated at an interface between the semiconductor substrate 130 and the front electrode 114. Due to the concentration of the surge current, destruction occurs at a Schottky junction surface and the n⁻-type epitaxial layer (the n⁻-type drift region 112) directly beneath the Schottky junction surface, whereby the pulled amount of the surge current pulled out from inside the semiconductor substrate 130 to the front electrode 114 decreases.

The pulled amount of the surge current was confirmed to increase in the diode having a JBS structure that uses a silicon semiconductor. Therefore, also in the conventional silicon carbide semiconductor device 140' depicted in FIG. 33, similarly to the diode having the JBS structure that uses a silicon semiconductor, the pulled amount of the surge current was assumed to increase due to a phenomenon of increases of the surge current resulting from bipolar operation of the pn junctions formed at the front surface of the semiconductor substrate 130 by the p-type regions 113 and the n⁻-type drift region 112; however, such an effect did not significantly appear.

One factor of the pulled amount of the surge current in the conventional silicon carbide semiconductor device 140' depicted in FIG. 33 being small is that an ohmic contact between the front electrode 114 and the p-type regions 113 configuring a pn junction part of the JBS structure does not have a sufficiently low resistance. Thus, it is assumed that a metal electrode (hereinafter, ohmic electrode) forming an ohmic contact with the p-type regions 113 is formed between the p-type regions 113 and the front electrode 114, surge current flows locally in the pn junction part of the JBS structure, and surge current tolerance is improved.

FIG. 35 is a cross-sectional view of an example of another conventional silicon carbide semiconductor device. FIG. 35 is FIG. 3 of Japanese Laid-Open Patent Publication No. 2008-282972. A conventional silicon carbide semiconductor device 150 depicted in FIG. 35 differs from the conventional silicon carbide semiconductor device 140' depicted in FIGS. 33 and 34 in that an ohmic electrode 133' is provided on the p-type regions 113 as a lowermost layer of the front electrode 114, and a mixture of a Schottky junction between the n⁻-type drift region 112 and a Schottky electrode 131', and ohmic contacts between the p-type regions 113 and the ohmic electrode 133' is present at the front surface of the semiconductor substrate 130.

As a method of manufacturing a silicon carbide diode having a conventional JBS structure, a method has been proposed in which only on a part of an n⁻-type drift region exposed at a front surface of a semiconductor substrate, a metal electrode (hereinafter, Schottky electrode) forming a Schottky junction with the n⁻-type drift region is formed and thereafter, on the front surface of the semiconductor substrate, an ohmic electrode that forms ohmic contacts with p-type regions that configure a pn junction part of the JBS structure is formed so as to cover the Schottky electrode (for example, refer to Japanese Patent No. 5546759).

Japanese Patent No. 5546759 discloses that aluminum (Al) or nickel (Ni) is used as a material of the ohmic electrode, and molybdenum (Mo) is used as a material of the Schottky electrode. Further, Japanese Patent No. 5546759 discloses a silicon carbide diode in which in the p-type regions configuring the pn junction part of the JBS structure, p⁺-type contact regions having an impurity concentration higher than that of the p-type regions are selectively formed, whereby an ohmic property of the p-type regions and the ohmic electrode is improved.

As an example of another method of manufacturing a silicon carbide diode having a conventional JBS structure, a method has been proposed in which an ohmic electrode is formed only on p-type regions that configure a pn junction part of the JBS structure and thereafter, on a front surface of a semiconductor substrate, a Schottky electrode that forms a Schottky junction with the n⁻-type drift region is formed so as to cover the ohmic electrode (for example, refer to Japanese Laid-Open Patent Publication No. 2008-282972). Japanese Laid-Open Patent Publication No. 2008-282972 discloses that aluminum is used as a material of the ohmic electrode and molybdenum (Mo) is used as a material of the Schottky electrode.

Further, as another method of manufacturing a silicon carbide diode having a conventional JBS structure, a method has been disclosed in which a silicon film and a nickel film are sequentially deposited on a semiconductor substrate containing silicon carbide, so as to have a stoichiometric composition ratio of 2:1 (=Si:Ni) and from only a silicide reaction therebetween, a Schottky junction with an n⁻-type drift region and a silicide (NiSi₂) film that forms an anode electrode that forms ohmic contacts with p-type regions configuring a pn junction part of the JBS structure are formed (for example, refer to Japanese Laid-Open Patent Publication No. 2003-158259).

As a method of forming an ohmic electrode on p-type regions, a method has been proposed in which on a semiconductor substrate containing silicon carbide, an aluminum film and a nickel film are sequentially deposited so as cover the p-type regions and thereafter, by annealing (heat treatment) of 1000 degrees C., silicon atoms in the semiconductor substrate and nickel atoms in the nickel film are caused to react to form a silicide, thereby forming a nickel silicide (NiSi) film that becomes an ohmic electrode forming ohmic contacts with the p-type regions (for example, N. Kiritani, et al, "Single Material Ohmic Contacts Simultaneously Formed on the Source/P-well/Gate of 4H—SiC Vertical MOSFETs", Materials Science Forum, Switzerland, Trans Tech Publications, 2003, Vol. 433-436, pp. 669-672).

As another method of forming an ohmic electrode on p-type regions, a method has been proposed in which on a semiconductor substrate containing silicon carbide, a nickel film and an aluminum film are sequentially deposited so as to cover the p-type regions and thereafter, these metal films and the semiconductor substrate are caused to react by a heat treatment of a temperature in a range from 850 degrees C. to 1050 degrees C., whereby a p-type ohmic electrode is formed from a nickel, aluminum, silicon, and carbon (C) alloy (for example, refer to Japanese Patent No. 4291875).

As another method of forming an ohmic electrode on p-type regions, a method has been proposed in which on a semiconductor substrate containing silicon carbide, an aluminum film and a silicon film are sequentially deposited so as to cover the p-type region and have an element composition ratio of 89:11 (=Al:Si); thereafter, by a heat treatment at a temperature in a range from 400 degrees C. to 500 degrees C., an alloy film of the aluminum film and the silicon film is formed as well as ohmic contacts between the alloy film and the p-type regions (for example, refer to Japanese Laid-Open Patent Publication No. H1-020616).

As another method of forming an ohmic electrode, a method has been proposed in which a nickel film is formed on a high-concentration impurity region that is formed by an ion implantation of silicon atoms into a semiconductor substrate containing silicon carbide, a precursor layer of a heated reaction layer is formed only at an interface between the high-concentration impurity region and the nickel film by a heat treatment at a temperature in a range from 400 degrees to 600 degrees C., and thereafter, the precursor layer of the heated reaction layer is inverted into the heated reaction layer having a low resistance, by a heat treatment of 950 degrees C. (for example, refer to Japanese Laid-Open Patent Publication No. 2017-175115).

As another method of forming an ohmic electrode, a method has been proposed in which in contact holes of an interlayer insulating film, a precursor layer of a heated reaction layer is formed between a semiconductor substrate containing silicon carbide and a metal material film by a heat treatment, and the precursor layer of the heated reaction layer is inverted into the heated reaction layer by a heat treatment of a temperature that is higher than that of an initial heat treatment (for example, refer to Japanese Laid-Open Patent Publication No. 2005-276978). Japanese Laid-Open Patent Publication No. 2005-276978 discloses that a material of the metal material film is titanium-aluminum or nickel, and the initial heat treatment is set at a low temperature at which no harmful solid phase reaction occurs between the metal material film and the interlayer insulating film.

Further, Japanese Laid-Open Patent Publication No. 2005-276978 discloses that the metal material film is formed so as to be in contact with an entire area of the surface of the semiconductor substrate in the contact holes of the interlayer insulating film; contact parts where the metal material film and the semiconductor substrate are in contact are converted into a silicide by a heat treatment; and in a silicide process of forming, by self-alignment, the heated reaction layer at entire surfaces of the contact parts, a part of the metal material film not converted into a silicide (part excluding the heated reaction layer) is removed by etching, whereby only the parts of the metal material film becoming the heated reaction layer are left.

FIG. 36 is a cross-sectional view of an example of an ohmic electrode formed by self-alignment according a method of manufacturing a conventional silicon carbide semiconductor device. FIG. 36 is FIG. 1 of Japanese Laid-Open Patent Publication No. 2005-276978. A conventional silicon carbide semiconductor device 160 depicted in FIG. 36 includes in a contact hole 163a of an interlayer insulating film 163, a heated reaction layer that becomes an ohmic electrode 164 electrically connected to a high-concentration impurity region 162 of a surface region of a semiconductor substrate 161 containing silicon carbide and a wiring layer 165 embedded in the contact hole 163a of the interlayer insulating film 163.

By self-alignment using the interlayer insulating film 163 as a mask, the ohmic electrode 164 is formed by the silicide process recited in Japanese Laid-Open Patent Publication No. 2005-276978, in an entire area of a surface of the semiconductor substrate 161 in the contact hole 163a of the interlayer insulating film 163. The ohmic electrode 164 is provided exposed in the contact hole 163a of the interlayer insulating film 163, at a surface region of the high-concentration impurity region 162 exposed at the surface of the semiconductor substrate 161 and protrudes from the front surface of the semiconductor substrate 161 in a direction away from the front surface of the semiconductor substrate 161.

SUMMARY OF THE INVENTION

According to an embodiment of the invention, a method of manufacturing a silicon carbide semiconductor device that includes an active region, and a termination region that includes a connecting region surrounding a periphery of the active region, includes providing a semiconductor substrate having a first main surface and a second main surface, the semiconductor substrate containing silicon carbide, and including a first-conductivity-type region of which a main surface is the first main surface of the semiconductor substrate, the first-conductivity-type region having a first region in the active region and a second region spanning an entire area of the connecting region; selectively forming a plurality of first second-conductivity-type regions in the first region of the first-conductivity-type region at the first main surface of the semiconductor substrate; forming a second second-conductivity-type region in the second region of the first-conductivity-type region at the first main surface of the semiconductor substrate; forming an oxide film at the first main surface of the semiconductor substrate, to cover the first-conductivity-type region, the plurality of first second-conductivity-type regions, and the second second-conductivity-type region; selectively removing the oxide film, to thereby form a plurality of first openings that expose the plurality of first second-conductivity-type regions, and form a second opening that exposes the second second-conductivity-type region in the connecting region; sequentially forming and stacking a metal film containing aluminum and a nickel film in the plurality of first openings and the second opening, to thereby form a metal material film; generating a compound layer in the plurality of first openings and the second opening of the oxide film, through self-alignment using the oxide film as a mask, the compound layer being generated by a first heat treatment causing the metal material film and the semiconductor substrate to react with each other; removing an excess part of the metal material film after generating the compound layer, the excess part excluding the compound layer; forming a nickel silicide film in ohmic contact with the semiconductor substrate, by generating nickel silicide in the compound layer through a second heat treatment after removing the excess part, the second heat treatment being performed at a temperature higher than a temperature of the first heat treatment; forming a contact hole that connects the plurality of first openings and the second opening with one another, the contact hole being formed by removing parts of the oxide film in the active region, after forming the nickel silicide film; forming, in the contact hole, a first electrode in which a titanium film that is in contact with the first-conductivity-type region and forms a Schottky junction with the first-conductivity-type region, and a metal electrode film that contains aluminum are sequentially stacked; and forming a second electrode at the second main surface of the semiconductor substrate.

In the embodiment, the plurality of first openings and the second opening are formed by selectively removing the oxide film by dry etching.

In the embodiment, the metal film is an aluminum film.

In the embodiment, the temperature of the first heat treatment is in a range from 400 degrees C. to 550 degrees C.

In the embodiment, the metal film is an aluminum-silicon film.

In the embodiment, the temperature of the first heat treatment is in a range from 400 degrees C. to 800 degrees C.

In the embodiment, the aluminum-silicon film has a thickness in a range from 5 nm to 300 nm.

In the embodiment, the aluminum-silicon film has a silicon concentration in a range from 0.1 wt % to 3 wt %.

In the embodiment, the temperature of the second heat treatment is in a range from 900 degrees C. to 1050 degrees C.

In the embodiment, forming the contact hole includes forming a resist mask that covers an outer peripheral part of the oxide film, from one of sidewalls of the second opening that is furthest from the active region, and removing the parts of the oxide film in the active region through wet etching using the resist mask as a mask.

According to another embodiment of the invention, a silicon carbide semiconductor device has an active region and a termination region that includes a connecting region surrounding a periphery of the active region. The silicon carbide semiconductor device includes a semiconductor substrate having a first main surface and a second main surface, the semiconductor substrate containing silicon carbide, and including a first-conductivity-type region of which a main surface is the first main surface of the semiconductor substrate; a plurality of first second-conductivity-type regions selectively provided in the first-conductivity-type region in the active region, at the first main surface of the semiconductor substrate, the plurality of first second-conductivity-type regions being in contact with the first-conductivity-type region; a second second-conductivity-type region provided in the first-conductivity-type region to have an entire area of the connecting region, at the first main surface of the semiconductor substrate, the second second-conductivity-type region being in contact with the first-conductivity-type region; an oxide film provided on the first main surface of the semiconductor substrate in the termination region, the oxide film having an inner end that faces the active region, the connecting region being between the active region and the oxide film; a first silicide film in ohmic contact with the plurality of first second-conductivity-type regions; a second silicide film in contact with the inner end of the oxide film and in ohmic contact with the second second-conductivity-type region; a first electrode in which a titanium film and a metal electrode film containing aluminum are stacked sequentially on the first main surface of the semiconductor substrate, the titanium film being in contact with and forming a Schottky junction with the first-conductivity-type region, and being in contact with and connected to the first silicide film and the second silicide film; and a second electrode provided at the second main surface of the semiconductor substrate.

In the embodiment, the first silicide film contains nickel, silicon, and aluminum.

In the embodiment, the first silicide film contains carbon.

In the embodiment, the second silicide film contains nickel, silicon, and aluminum.

In the embodiment, the second silicide film contains carbon.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 11 is a cross-sectional view depicting a state of the silicon carbide semiconductor device according to the first embodiment during manufacture.

FIG. 12 is a cross-sectional view depicting a state of the silicon carbide semiconductor device according to the first embodiment during manufacture.

DETAILED DESCRIPTION OF THE INVENTION

Figure 33:
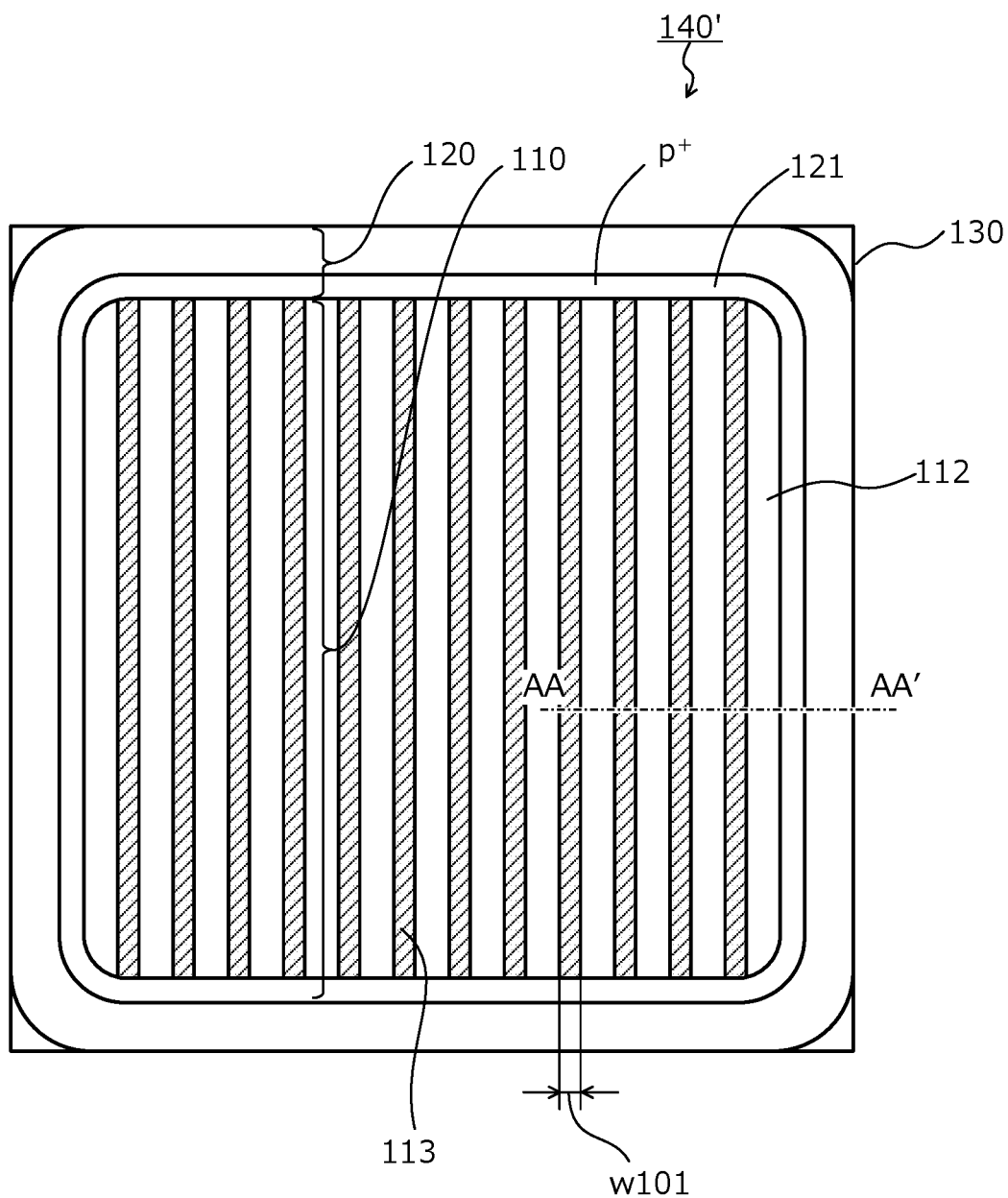
FIG. 33 is a plan view depicting an example of a state of another conventional silicon carbide semiconductor device when viewed from a front side of a semiconductor substrate.
Figure 34:
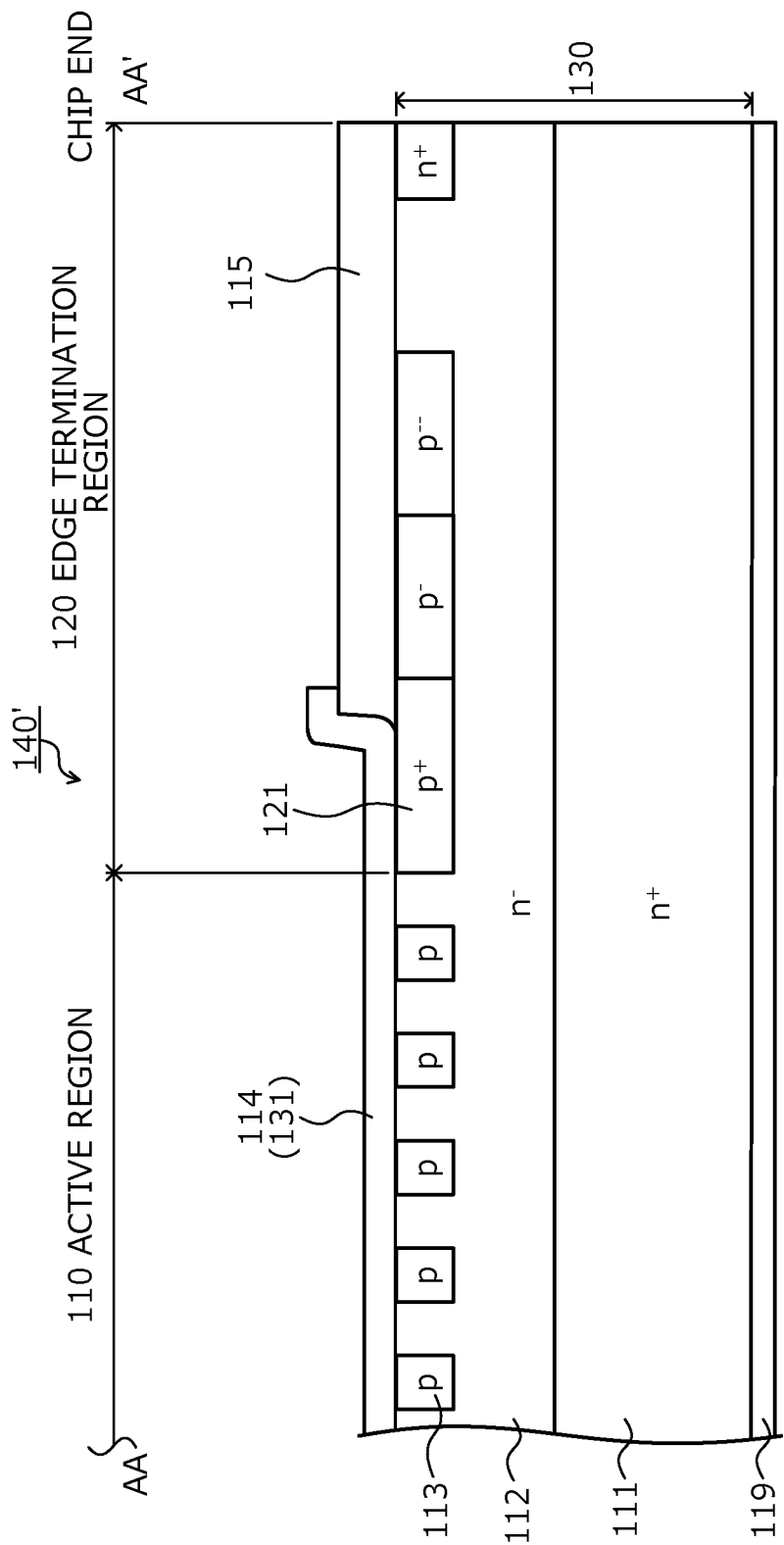
FIG. 34 is a cross-sectional view of the structure along cutting line AA-AA' in in FIG. 33.

First, problems associated with the conventional techniques will be discussed. To improve the surge current tolerance of the conventional silicon carbide semiconductor device 140' (silicon carbide diode having a JBS structure, refer to FIGS. 33 and 34) described above, when the ohmic electrode is provided only in contact with the p-type regions 113 between the semiconductor substrate 130 and the Schottky electrode (the titanium film 131), and the ohmic electrode is a nickel silicide film, contact resistance between the p-type regions 113 and the ohmic electrode cannot be sufficiently reduced and therefore, a predetermined design value of the surge current tolerance is unattainable.

To reduce the contact resistance between the p-type regions 113 and the ohmic electrode, when a mathematical area of a junction (junction area) between the p-type regions 113 and the ohmic electrode is increased and a mathematical surface area of the active region 110 is kept the same, as a junction area of the p-type regions 113 and the ohmic electrode increases, a junction area of the n$^-$-type drift region 112 and the Schottky electrode decreases. Therefore, during forward bias, electron current flow from the type drift region 112 toward the Schottky electrode decreases and reductions in forward voltage (Vf) become difficult.

Thus, to set a junction area necessary for setting the junction area of the p-type regions 113 and the ohmic electrode for a predetermined surge current tolerance and to set the junction area of the n$^-$-type drift region 112 and the Schottky electrode to be as large as possible, the ohmic electrode is formed only on the p-type regions 113 and between adjacent p-type regions 11, and the Schottky electrode is formed at an entire area of the surface of the n$^-$-type drift region 112. Further, a material of the ohmic electrode is a stacked film of aluminum/nickel, thereby enabling reduction of the contact resistance between the p-type regions 113 and the ohmic electrode.

Nonetheless, a width w101 of the p-type regions 113 (refer to FIG. 33) is narrow at a few μm or less and therefore, patterning control for the stacked film having metals (aluminum and nickel) of two different types and differing etching rates is difficult and with consideration of process margins of mass production, the ohmic electrode is formed to have a width narrower than the width w101 of the p-type regions 113. Therefore, the p-type regions 113 and the Schottky electrode contact each other, forming a non-operating region in which the contact resistance is not reduced, whereby characteristics sufficient for increasing the pulled amount of the surge current cannot be obtained.

Figure 35:
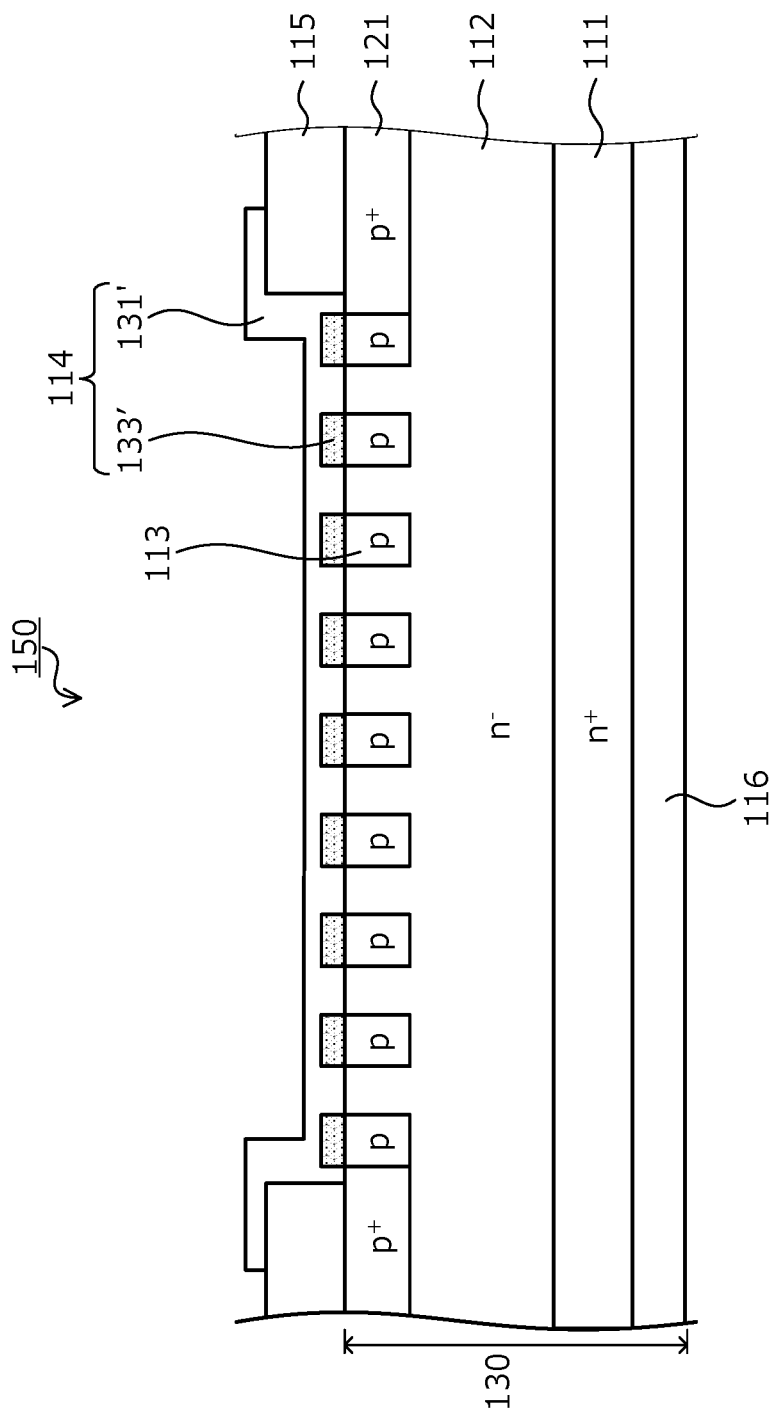
FIG. 35 is a cross-sectional view of an example of another conventional silicon carbide semiconductor device.
Figure 36:
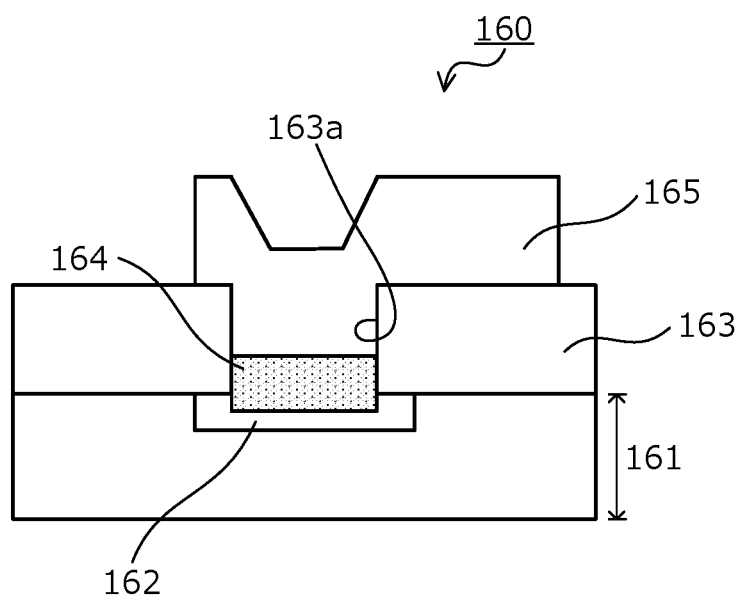
FIG. 36 is a cross-sectional view of an example of an ohmic electrode formed by self-alignment according a method of manufacturing a conventional silicon carbide semiconductor device.

In the technique recited in Japanese Laid-Open Patent Publication No. 2008-282972, the metal film is patterned by photolithography and etching, thereby leaving a part that becomes the ohmic electrode 133' (refer to FIG. 35). Therefore, the number of processes increase, leading to increases in cost. Further, patterning of the metal film is limited by the minimum processing dimension by etching and thus, is not suitable for size reductions. When size reductions are impossible, the junction area of the Schottky electrode at a surface of the semiconductor substrate 130 decreases and therefore, as described above, reduction of the forward voltage decreases.

In the technique recited in Japanese Laid-Open Patent Publication No. 2005-276978, as described above, the ohmic electrode 164 having a fine pattern is formed in the contact hole 163a of the interlayer insulating film 163 by self-alignment using the interlayer insulating film 163 as a mask, nonetheless, it was confirmed that the contact resistance between the high-concentration impurity region 162 and the ohmic electrode 164 is not sufficiently reduced. Further, when a general self-alignment technique such as that recited in Japanese Laid-Open Patent Publication No. 2008-282972 and Japanese Laid-Open Patent Publication No. 2005-276978 is applied in a case where a stacked film including an aluminum film and a nickel film is used as a material, the following problems were found to occur.

Figure 30A:
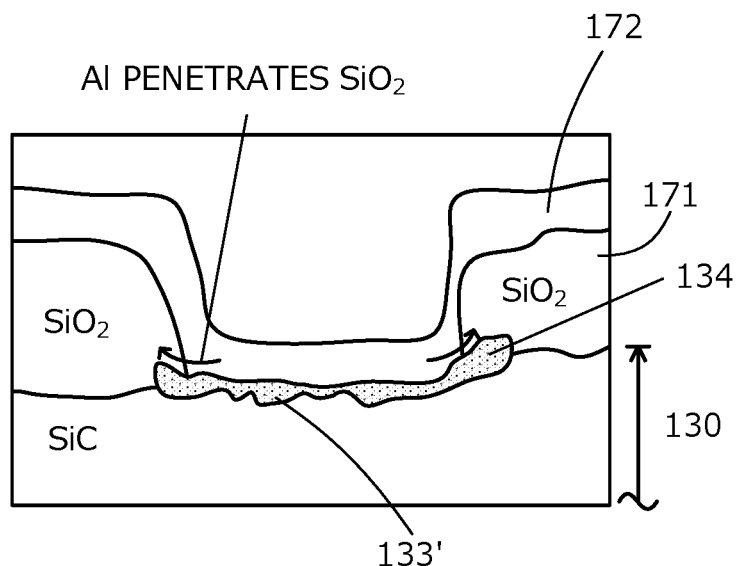
FIG. 30A is diagram schematically depicting a state of a conventional ohmic electrode during formation.
Figure 30B:
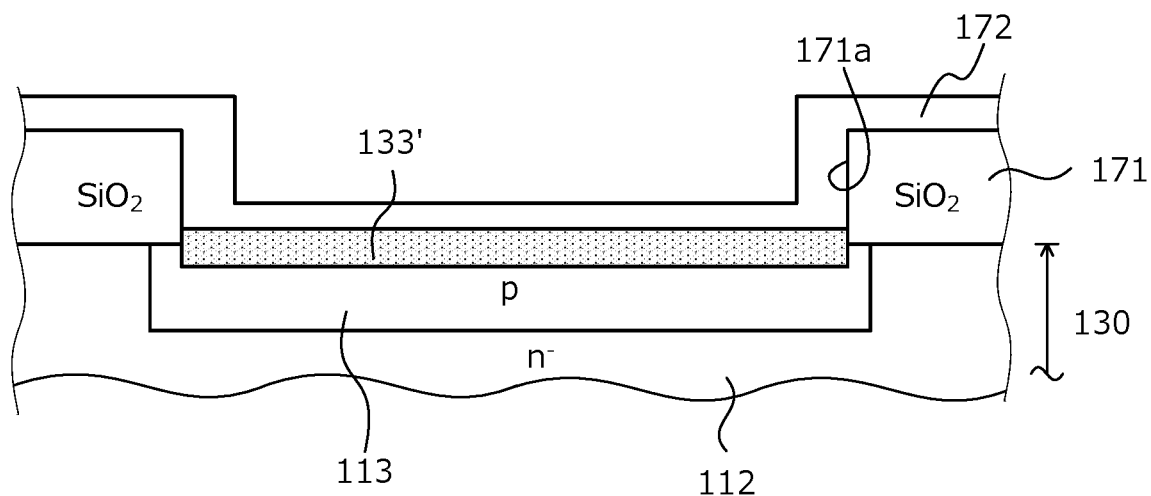
FIG. 30B is a cross-sectional view of the conventional ohmic electrode during formation.
Figure 31A:
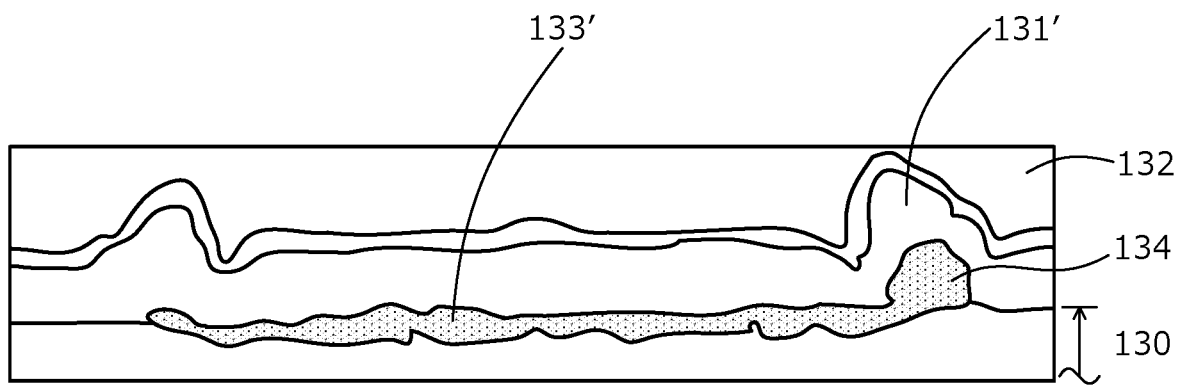
FIG. 31A is an enlarged view of the state depicted in FIG. 30A.
Figure 31B:
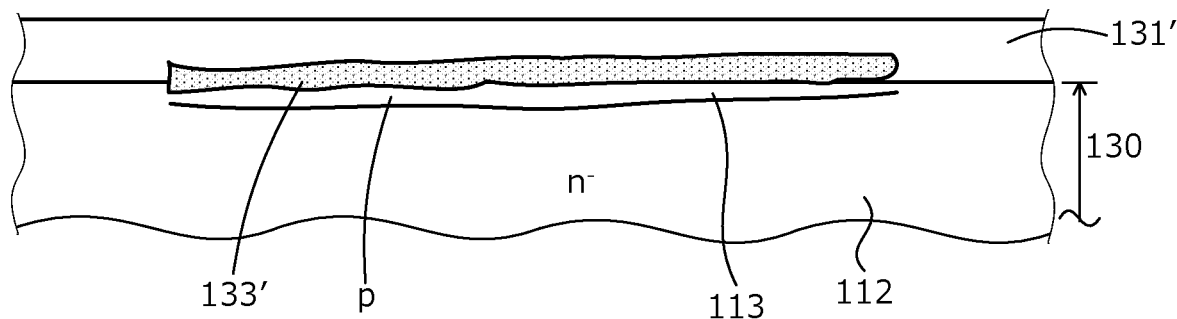
FIG. 31B is an enlarged view of the cross-sectional view depicted in FIG. 30B.
Figure 32:
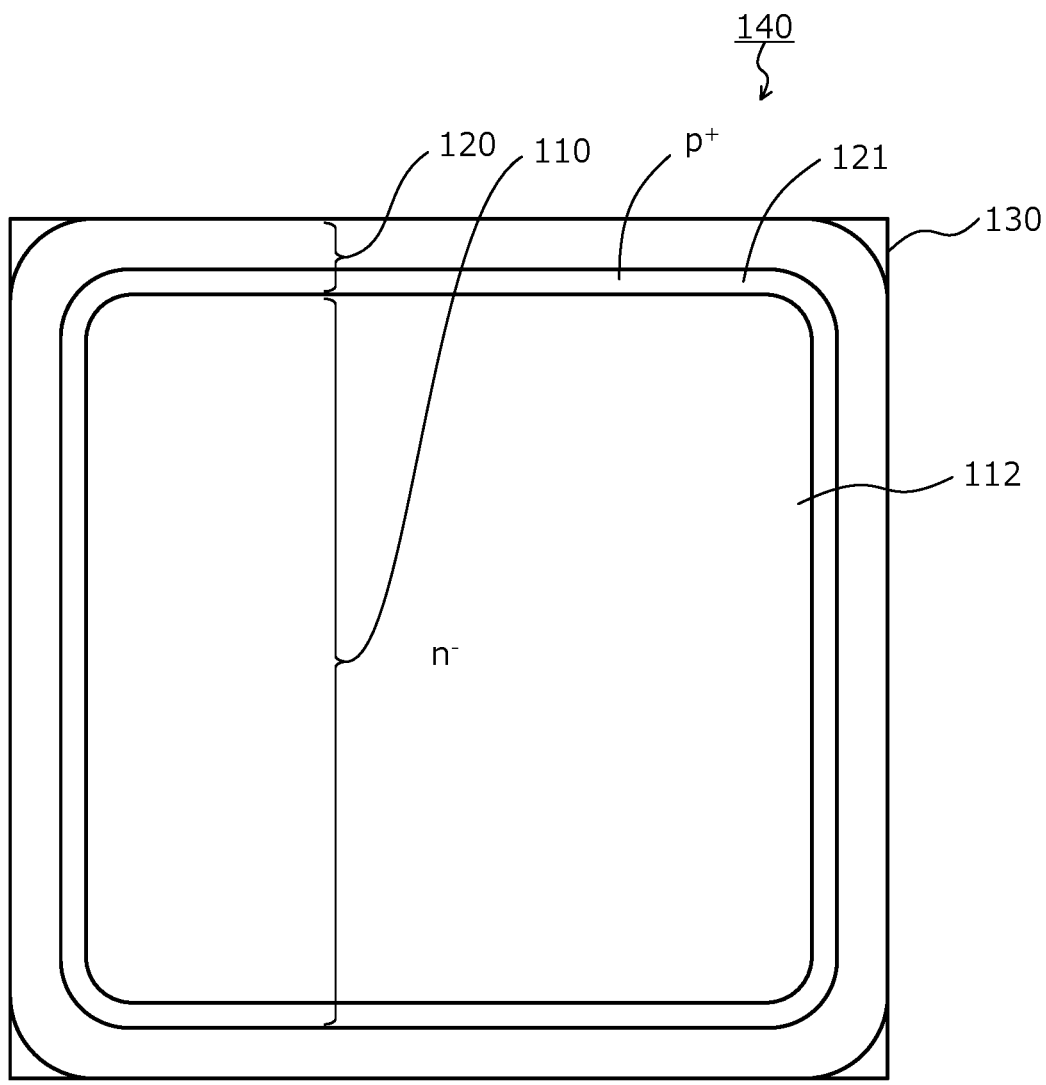
FIG. 32 is a plan view of a conventional silicon carbide semiconductor device when viewed from a front side of a semiconductor substrate.

For example, a case in which the ohmic electrode 133' is formed only on the p-type regions 113 will be described as an example. FIGS. 30A and 30B are diagrams depicting a state of a conventional ohmic electrode during formation. FIGS. 31A and 31B are enlarged views of the state of the conventional ohmic electrode. FIGS. 30A and 31A schematically depict the state of the ohmic electrode 133' observed by a scanning electron microscope (SEM); and FIGS. 30B and 31B depict cross-sectional views near the ohmic electrode 133'.

As depicted in FIGS. 30A and 30B, on the front surface of the semiconductor substrate 130, an oxide film mask 171 that covers the n$^-$-type drift region 112 is formed between adjacent p-type regions 113. Next, on the oxide film mask 171, in openings 171a of the oxide film mask 171, a metal material film 172 is formed so as to be in contact with the p-type regions 113. Subsequently, by a heat treatment, the metal material film 172 and the semiconductor substrate 130 are caused to react and form a silicide, whereby a nickel silicide film that becomes the ohmic electrode 133' is formed.

When the metal material film 172 is a stacked film including an aluminum film and a nickel film, during the heat treatment for converting the contact parts where the metal material film 172 and the semiconductor substrate 130 contact each other into a silicide, aluminum atoms in the metal material film 172 enter the oxide film mask 171 and react therewith, thereby generating a product 134 in the oxide film mask 17. It was confirmed that the product 134 remains between the semiconductor substrate 130 and the Schottky electrode 131' even after completion of the device (refer to FIGS. 31A and 31B), becoming a source of leak current.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
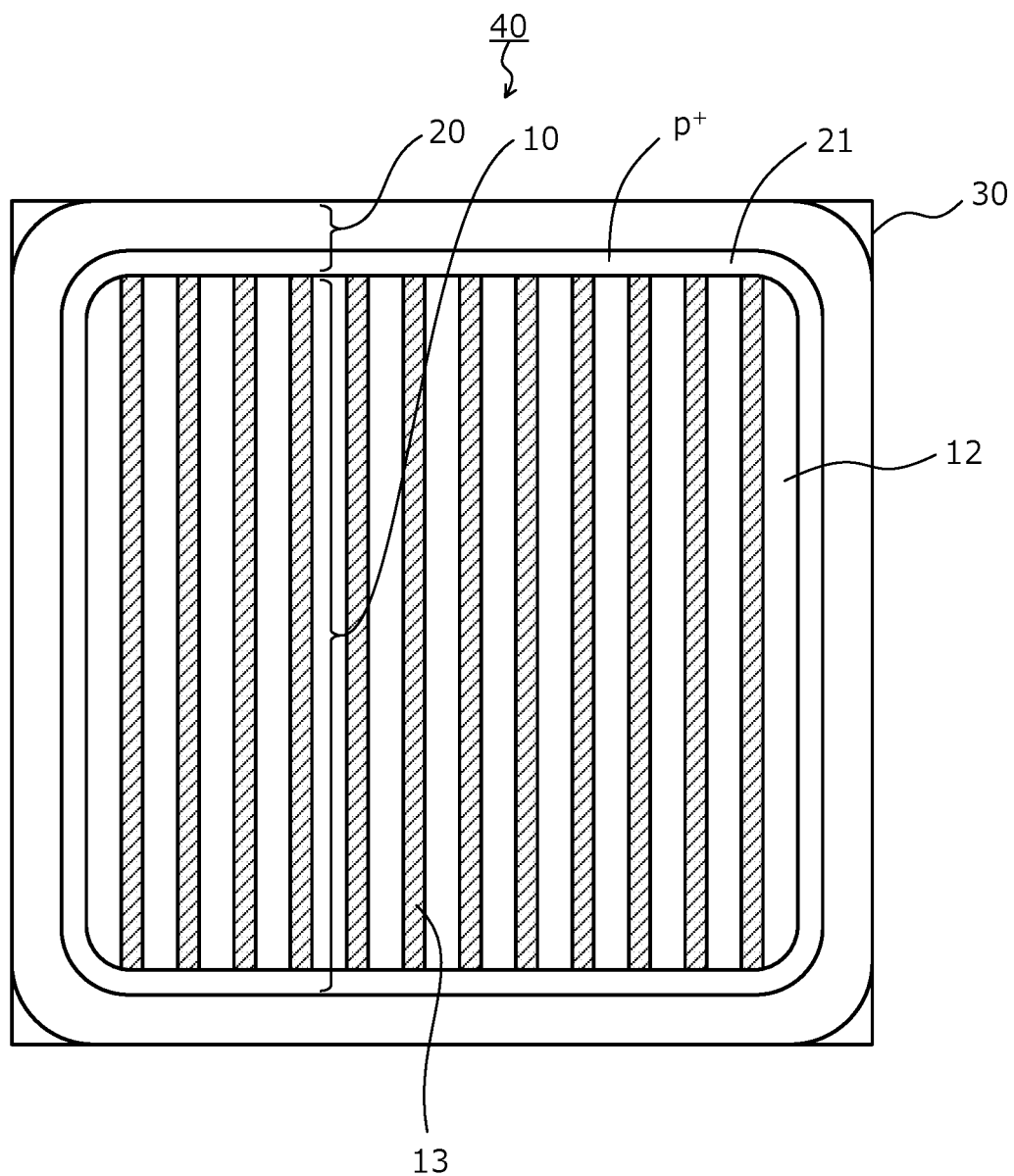
FIG. 1 is a plan view depicting a layout of a silicon carbide semiconductor device according to a first embodiment when viewed from a front side of a semiconductor substrate.
Figure 2:
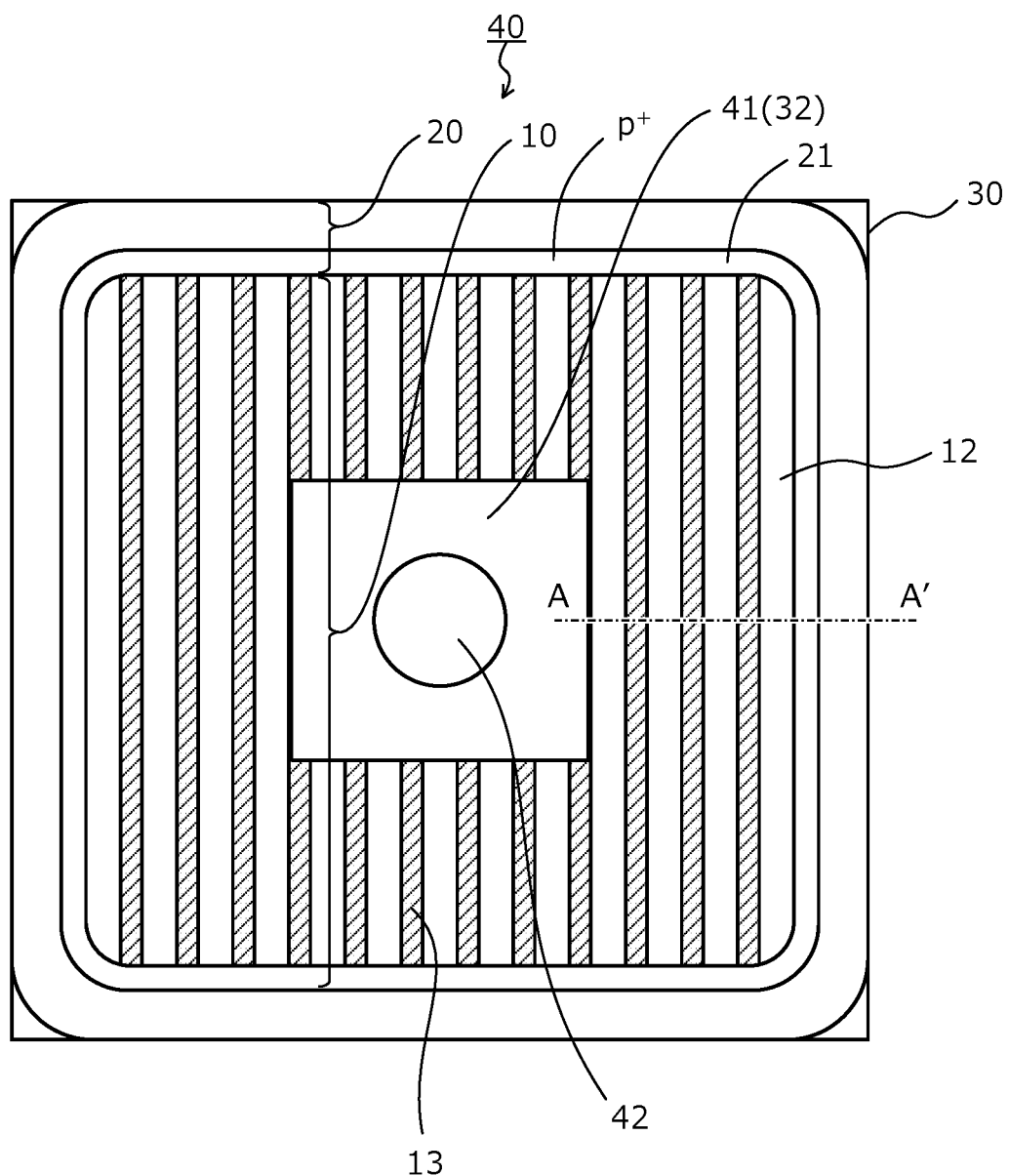
FIG. 2 is a plan view depicting a layout of the silicon carbide semiconductor device according to the first embodiment when viewed from the front side of the semiconductor substrate.

A structure of a silicon carbide semiconductor device according to a first embodiment will be described. FIGS. 1 and 2 are plan views depicting a layout of the silicon carbide semiconductor device according to the first embodiment when viewed from a front side of a semiconductor substrate. FIG. 1 depicts an example of a layout of p-type regions (first second-conductivity-type regions) 13 that configure a JBS structure. FIG. 2 depicts an example of a layout of a bonding pad 41 among parts on a front surface of a semiconductor substrate (semiconductor chip) 30 containing silicon carbide (SiC).

A silicon carbide semiconductor device 40 according to the first embodiment and depicted in FIGS. 1 and 2 is a silicon carbide diode having in an active region 10, at the front side of the semiconductor substrate 30, a SBD structure configured by Schottky junctions between a front electrode (first electrode) 14 (refer to FIG. 3) and an n$^-$-type drift region (first-conductivity-type region) 12, and a JBS structure configured by pn junctions between the p-type regions 13 and the n$^-$-type drift region 12.

The n$^-$-type drift region 12 and the p-type regions 13 are disposed substantially evenly and substantially uniformly at a surface of the active region 10. The n$^-$-type drift region 12 and the p-type regions 13, for example, are disposed in a striped pattern extending in a same direction parallel to the front surface of the semiconductor substrate 30 and are disposed in contact with one another and repeatedly alternate one another along a width direction that is orthogonal to a longitudinal direction along which the n$^-$-type drift region 12 and the p-type regions 13 extend in the striped pattern. The n$^-$-type drift region 12 is exposed at the front surface of the semiconductor substrate 30, between adjacent p-type regions 13.

The active region 10 is a region in which current flows when the silicon carbide diode is in an ON state. The active region 10, for example, has a substantially rectangular planar shape and is disposed at substantially a center of the semiconductor substrate 30. The edge termination region 20 is a region between the active region 10 and an end of the semiconductor substrate 30, and surrounds a periphery of the active region 10. The edge termination region 20 is a region that, in the n$^-$-type drift region 12, mitigates electric field at the front side of the semiconductor substrate 30 and sustains a breakdown voltage. The breakdown voltage is a voltage limit at which no errant operation or destruction of an element occurs.

Figure 3:
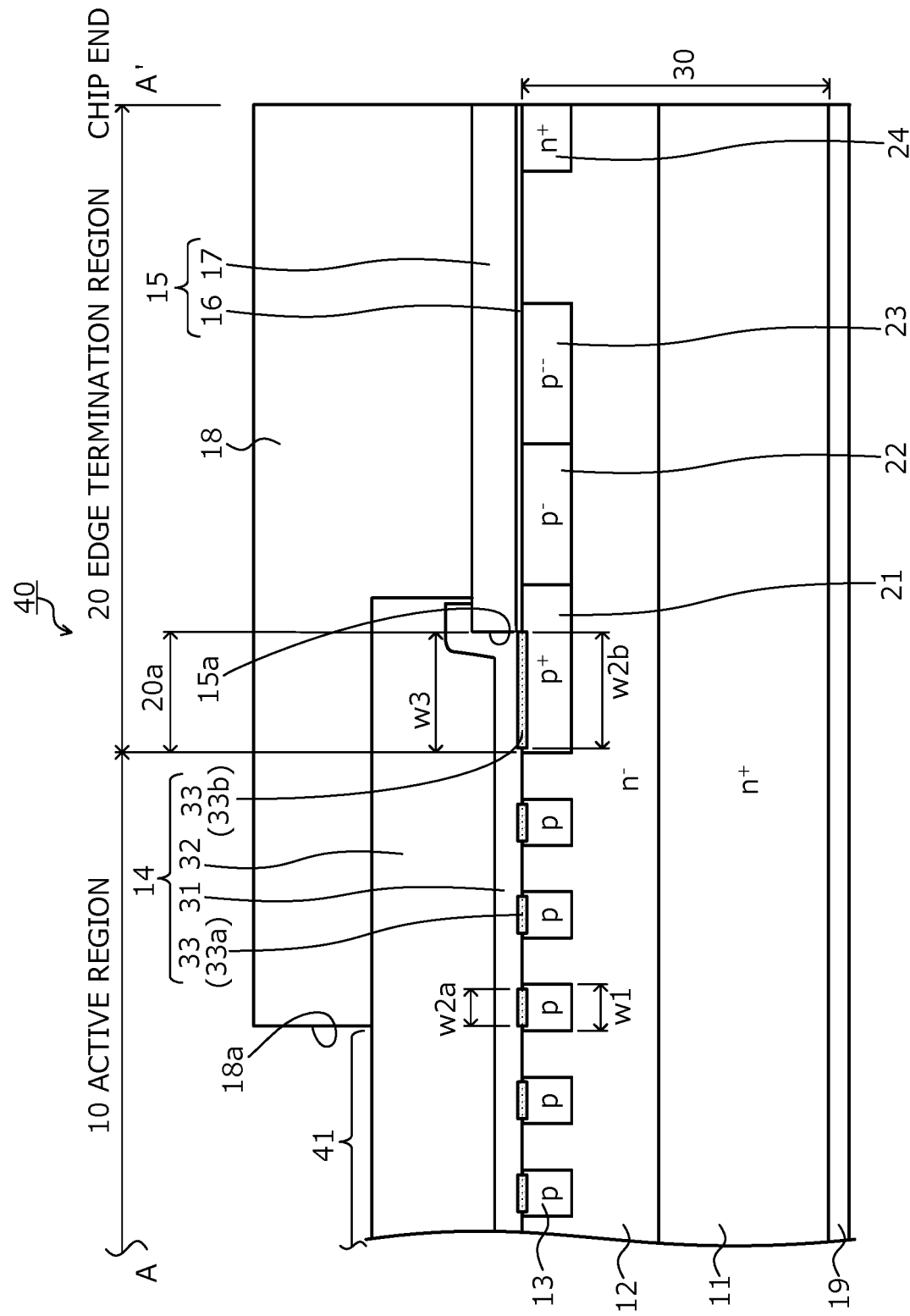
FIG. 3 is a cross-sectional view of a structure along cutting line A-A in FIG. 2.

In the edge termination region 20, a voltage withstanding structure such as a junction termination extension (JTE) structure is disposed (refer to FIG. 3). The JTE structure is a voltage withstanding structure in which, from a center-side (side nearest the center of the semiconductor substrate 30) thereof to an end-side (side nearest the end of the semiconductor substrate 30) thereof, plural p-type regions (in FIG. 3, reference numerals 22, 23) having differing impurity concentrations are disposed in descending order of impurity concentration, in a circular concentric pattern around a center of the active region.

Further, at a connecting region 20a (refer to FIG. 3) of the edge termination region 20, a field limiting ring (FLR (second second-conductivity-type region)) 21 is disposed. The FLR 21 is a p$^+$-type region that surrounds a periphery of the active region 10 in a substantially rectangular shape, and is in contact with a p$^-$-type region 22 (refer to FIG. 3) that extends from the connecting region 20a of the edge termination region 20 toward the end of the semiconductor substrate 30. The FLR 21 may be in contact with the p-type regions 13, along the longitudinal direction along which the p-type regions 13 extend in the striped pattern.

The connecting region 20a of the edge termination region 20 is a region between the active region 10 and a field oxide film 15 described hereinafter; the connecting region 20a surrounds a periphery of the active region 10 and connects the active region 10 and a voltage withstanding structure part of the edge termination region 20. The voltage withstanding structure part of the edge termination region 20 is a part of the edge termination region 20, from an end of the field oxide film 15 described hereinafter nearest the center of the semiconductor substrate 30 to an end (chip end) of the semiconductor substrate 30, the part in which a predetermined voltage withstanding structure such as the JTE structure and an n$^+$-type channel stopper region 24 are disposed (refer to FIG. 3).

The front electrode 14 (refer to FIG. 3) is provided on the front surface of the semiconductor substrate 30, in the active region 10. The front electrode 14 is in contact with the n$^-$-type drift region 12 and the p-type regions 13, and is electrically connected to the n$^-$-type drift region 12 and the p-type regions 13. On the front surface of the semiconductor substrate 30, a passivation film 18 (refer to FIG. 3) is provided. The passivation film 18 functions as protective film that protects the front electrode 14 and the element structure at the front side of the semiconductor substrate 30.

In the passivation film 18, an opening 18a that exposes a part of the front electrode 14 is provided. The part of the front electrode 14 exposed in the opening 18a of the passivation film 18 functions as the bonding pad 41. The bonding pad 41, for example, is disposed at the center of the semiconductor substrate 30. A non-depicted aluminum (Al) wire, which is a most common wiring connection when current is supplied to the bonding pad 41, is bonded (joined) to the bonding pad 41.

In FIG. 2, a bonding part 42 of the bonding pad 41 and the aluminum wire (not depicted) is indicated by a circular planar shape. For the bonding part 42 of the bonding pad 41 and the aluminum wire, for example, a mathematical surface area of about 1 square-mm has to be assumed when the aluminum wire has a diameter of 500 μm and is bonded to the bonding pad 41. A reason for this is that, at a surface of the semiconductor substrate 30, when surge voltage is applied and surge current flows in the forward direction, the flow of the surge current differs depending on the breakdown voltage of the silicon carbide diode.

While disposal of the bonding pad 41 at the center of the semiconductor substrate 30 is favorable, as described above, the $n^-$-type drift region 12 and the p-type regions 13 are disposed substantially evenly and substantially uniformly at a surface of the active region 10 and therefore, even when the bonding pad 41 is not disposed at the center of the semiconductor substrate 30, electrical characteristics are not adversely affected. Therefore, degrees of freedom for wire bonding are high.

Next, a cross-sectional view of the silicon carbide semiconductor device 40 according to the first embodiment will be described. FIG. 3 is a cross-sectional view of the structure along cutting line A-A in FIG. 2. As described above, the silicon carbide semiconductor device 40 according to the first embodiment includes the JBS structure and the SBD structure of the silicon carbide diode, in the active region 10 of the semiconductor substrate 30 containing silicon carbide and includes the JTE structure as the voltage withstanding structure, in the edge termination region 20.

The semiconductor substrate 30 is an epitaxial substrate in which an type epitaxial layer that becomes the $n^-$-type drift region 12 is stacked on a front surface of an $n^+$-type starting substrate 11 that contains silicon carbide. The $n^+$-type starting substrate 11 is an $n^+$-type cathode region. The semiconductor substrate 30 has a main surface (surface of the $n^-$-type epitaxial layer that constitutes the $n^-$-type drift region 12) including the $n^-$-type drift region 12 and regarded as the front surface and a main surface (back surface of the $n^+$-type starting substrate 11) including the $n^+$-type starting substrate 11 and regarded as a back surface.

In the active region 10, at a surface region of the front side of the semiconductor substrate 30, at least one of the p-type regions 13 that configure the JBS structure is selectively provided. The p-type regions 13 are provided between the front surface of the semiconductor substrate 30 and the $n^-$-type drift region 12. The p-type regions 13 are exposed at the front surface of the semiconductor substrate 30 and are in contact with the $n^-$-type drift region 12.

In the edge termination region 20, the FLR 21, at least one p-type region (herein, two including the $p^-$-type region 22 and a $p^{---}$-type region 23) configuring the JTE structure, and the $n^+$-type channel stopper region 24 are each provided at surface regions of the front side of the semiconductor substrate 30. The FLR 21 is provided at an entire area of the connecting region 20a of the edge termination region 20, extends from the connecting region 20a, toward the end of the semiconductor substrate 30, and is in contact with the $p^-$-type region 22. A region closer to the center of the semiconductor substrate 30 than is the FLR 21 is the active region 10.

The $p^-$-type region 22 is separate from the connecting region 20a of the edge termination region 20, is disposed closer to the end of the semiconductor substrate 30 than is the FLR 21, and is adjacent to the FLR 21. The $p^{---}$-type region 23 is disposed closer to the end of the semiconductor substrate 30 than is the $p^-$-type region 22 and is adjacent to the $p^-$-type region 22. The $n^+$-type channel stopper region 24 is disposed closer to the end of the semiconductor substrate 30 than is the $p^{---}$-type region 23 and is separate from the $p^{---}$-type region 23. The $n^+$-type channel stopper region 24 is exposed at the end of the semiconductor substrate 30 (chip end).

The FLR 21, the $p^-$-type region 22, the $p^{---}$-type region 23, and the $n^+$-type channel stopper region 24 are disposed between the front surface of the semiconductor substrate 30 and the $n^-$-type drift region 12. The FLR 21, the $p^-$-type region 22, the $p^{---}$-type region 23, and the $n^+$-type channel stopper region 24 are exposed at the front surface of the semiconductor substrate 30 and are in contact with the $n^-$-type drift region 12. Depths of the FLR 21, the $p^-$-type region 22, the $p^{---}$-type region 23, and the $n^+$-type channel stopper region 24, for example, may be equal to a depth of the p-type regions 13.

The front surface of the semiconductor substrate 30 is covered by the field oxide film 15. The field oxide film 15, for example, may be a stacked film including sequentially a thermal oxide film 16 and a deposited oxide film 17. The thermal oxide film 16 is capable of improving adhesiveness between the semiconductor substrate 30 and the field oxide film 15. The field oxide film 15 includes the deposited oxide film 17, thereby enabling formation of the field oxide film 15 in a shorter time as compared to a case in which all of the field oxide film 15 is the thermal oxide film 16.

In the field oxide film 15, a contact hole 15a that exposes substantially an entire area of the front surface of the semiconductor substrate 30 in the active region 10 is provided. A sidewall (sidewall of the field oxide film 15 nearest the active region 10) of the contact hole 15a of the field oxide film 15, for example, is substantially orthogonal to the front surface of the semiconductor substrate 30. The contact hole 15a of the field oxide film 15 is provided at an entire area of the active region 10 and the connecting region 20a of the edge termination region 20.

In the contact hole 15a of the field oxide film 15, the $n^-$-type drift region 12 and the p-type regions 13 in the active region 10, and a part of the FLR 21 the active region 10 in the edge termination region 20 are exposed. In the contact hole 15a of the field oxide film 15, on the front surface of the semiconductor substrate 30, the front electrode 14 that functions as an anode electrode is provided along the front surface of the semiconductor substrate 30.

The front electrode 14 has a layered structure in which a titanium film 31 and an aluminum alloy film (metal electrode film containing aluminum) 32 are sequentially stacked. In addition, the front electrode 14 has nickel silicide (NiSi) films 33 (33a, 33b) that are selectively provided lowermost, between the front surface of the semiconductor substrate 30 and the titanium film 31. The nickel silicide films 33 contain aluminum. The nickel silicide films 33 may contain carbon (C). The front electrode 14 may extend on the field oxide film 15 toward an end of the semiconductor substrate 30.

The titanium film 31 is provided at an entire area of the front surface of the semiconductor substrate 30 in the contact hole 15a, and is in contact with the $n^-$-type drift region 12. A part of the titanium film 31 bonded to the $n^-$-type drift region 12 is a Schottky electrode that forms a Schottky junction with the type drift region 12. The titanium film 31 may extend on the field oxide film 15, toward an end of the semiconductor substrate 30 and, for example, may terminate at a position facing the FLR 21 in a depth direction.

The aluminum alloy film 32 covers an entire area of the titanium film 31, is electrically connected to the titanium film 31, and is electrically connected to the nickel silicide films 33, via the titanium film 31. The aluminum alloy film 32 may extend on the field oxide film 15, toward an end of the semiconductor substrate 30 to a greater extent that does the titanium film 31 and, for example, may terminate at a position facing the $p^-$-type region 22 in the depth direction.

The aluminum alloy film 32, for example, is an aluminum-silicon (AlSi) film. Instead of the aluminum alloy film 32, an aluminum film may be provided.

The nickel silicide films 33 include first nickel silicide films 33a provided between the p-type regions 13 and the titanium film 31 and a second nickel silicide film 33b provided between the FLR 21 and the titanium film 31. The first nickel silicide films 33a are ohmic electrodes that form ohmic contacts with the p-type regions 13. Surge current is generated in the semiconductor substrate 30 and flows in the forward direction during surge voltage application; and the first nickel silicide films 33a have a function of increasing an amount (pulled amount) of the surge current pulled out from the semiconductor substrate 30 to the front electrode 14, and improving surge current tolerance.

The first nickel silicide films 33a, as described hereinafter, are formed at parts where the p-type regions 13 and a metal material film 52 (refer to FIG. 10) deposited on the front surface of the semiconductor substrate 30 are in contact with each other, the first nickel silicide films 33a being formed by causing surface regions of the semiconductor substrate 30 and the metal material film 52 to react by a heat treatment. Therefore, the first nickel silicide films 33a are provided at surface regions of the front surface of the semiconductor substrate 30, are in contact with the p-type regions 13 in the depth direction, and protrude from the front surface of the semiconductor substrate 30, in a direction away from the front surface of the semiconductor substrate 30.

The first nickel silicide films 33a each may have a width w2a that, for example, is substantially equal to a width w1 of each of the p-type regions 13. By setting the width w2a of the first nickel silicide films 33a to be equal to the width w1 of the p-type regions 13, the p-type regions 13 are not exposed at the front surface of the semiconductor substrate 30. As a result, a Schottky junction having high resistance is not formed between the p-type regions 13 and the titanium film 31, whereby forward voltage (Vf) of the silicon carbide diode may be reduced as compared to a case in which the p-type regions 13 are exposed at the front surface of the semiconductor substrate 30.

The width w2a of the first nickel silicide films 33a may be narrower than the width w1 of the p-type regions 13. By setting the width w2a of the first nickel silicide films 33a to be narrower than the width w1 of the p-type regions 13, design margins may be taken for improving positioning accuracy of a mask (remaining part of the field oxide film 15 described hereinafter, refer to FIG. 10) used when the first nickel silicide films 33a are formed. As a result, the first nickel silicide films 33a may be disposed accurately at positions facing the p-type regions 13 in the depth direction.

The second nickel silicide film 33b is an ohmic electrode that forms an ohmic contact with the FLR 21. The second nickel silicide film 33b is provided at substantially an entire area of a surface of the FLR 21 in the connecting region 20a of the edge termination region 20. The second nickel silicide film 33b is in contact with the field oxide film 15 at a sidewall of the field oxide film 15, the sidewall (outer sidewall) nearest an end of the semiconductor substrate 30. The second nickel silicide film 33b, similarly to the first nickel silicide films 33a, has a function of increasing the pulled amount of the surge current and improving surge current tolerance.

Provision of the second nickel silicide film 33b enables disposal of an ohmic electrode in the connecting region 20a of the edge termination region 20, the ohmic electrode having a same function as the first nickel silicide films 33a. As a result, even when chip size (planar dimension parallel to the front surface of the semiconductor substrate 30) is reduced, an ohmic junction area of the front electrode 14 and the semiconductor substrate 30, necessary for obtaining a predetermined surge current tolerance may be sufficiently established by a total junction area of the first and the second nickel silicide films 33a, 33b and the semiconductor substrate 30.

Further, extension of the second nickel silicide film 33b toward an end of the semiconductor substrate 30 to a position in contact with the field oxide film 15 enables maximization of the ohmic junction area of the FLR 21 and the second nickel silicide film 33b. As a result, a width w2b of the second nickel silicide film 33b is substantially equal to a width w3 of the connecting region 20a of the edge termination region 20 and as described above, the second nickel silicide film 33b may be provided at substantially an entire area of the surface of the FLR 21 in the connecting region 20a of the edge termination region 20.

Further, similarly to a case in which the width w2b of the second nickel silicide film 33b is substantially equal to the width w3 of the connecting region 20a of the edge termination region 20 and the width w2a of the first nickel silicide films 33a is substantially equal to the width w1 of the p-type regions 13, reduction of the forward voltage of the silicon carbide diode may be facilitated. The width w2b of the second nickel silicide film 33b, for example, may be narrower than the width w3 of the connecting region 20a of the edge termination region 2. A reason for this is that the width w2a of the first nickel silicide films 33a may be narrower than the width w1 of the p-type regions 13.

The second nickel silicide film 33b, as described hereinafter, is formed at a part where the FLR 21 and the metal material film 52 that is deposited on the front surface of the semiconductor substrate 30 are in contact with each other, the second nickel silicide film 33b being formed by causing the semiconductor substrate 30 and the metal material film 52 to react by a heat treatment. The second nickel silicide film 33b is provided at a surface region of the front surface of the semiconductor substrate 30, is in contact with the FLR 21 in the depth direction, and protrudes from the front surface of the semiconductor substrate 30 in an external direction away from the front surface of the semiconductor substrate 30.

A part of the front surface of the semiconductor substrate 30 other than a part in contact with the front electrode 14 is covered by the field oxide film 15. At an outermost surface of the front surface of the semiconductor substrate 30, the passivation film 18 containing a polyimide is provided. Here, a channel stopper electrode in contact with and electrically connected to the $n^+$-type channel stopper region 24 may be provided at a top of the $n^+$-type channel stopper region 24. The channel stopper electrode, for example, may be an aluminum alloy film that is formed concurrently with the aluminum alloy film 32.

The passivation film 18 is a protective film that protects the front electrode 14 and the field oxide film 15. In the passivation film 18, the opening 18a that exposes a part of the aluminum alloy film 32 is provided in the active region 10. A part of the front electrode 14 exposed in the opening 18a of the passivation film 18 functions as the bonding pad 41. A back electrode (second electrode) 19 is provided at an entire area of the back surface (back surface of the $n^+$-type starting substrate 11) of the semiconductor substrate 30 and is electrically connected to the $n^+$-type starting substrate 11.

Figure 4:
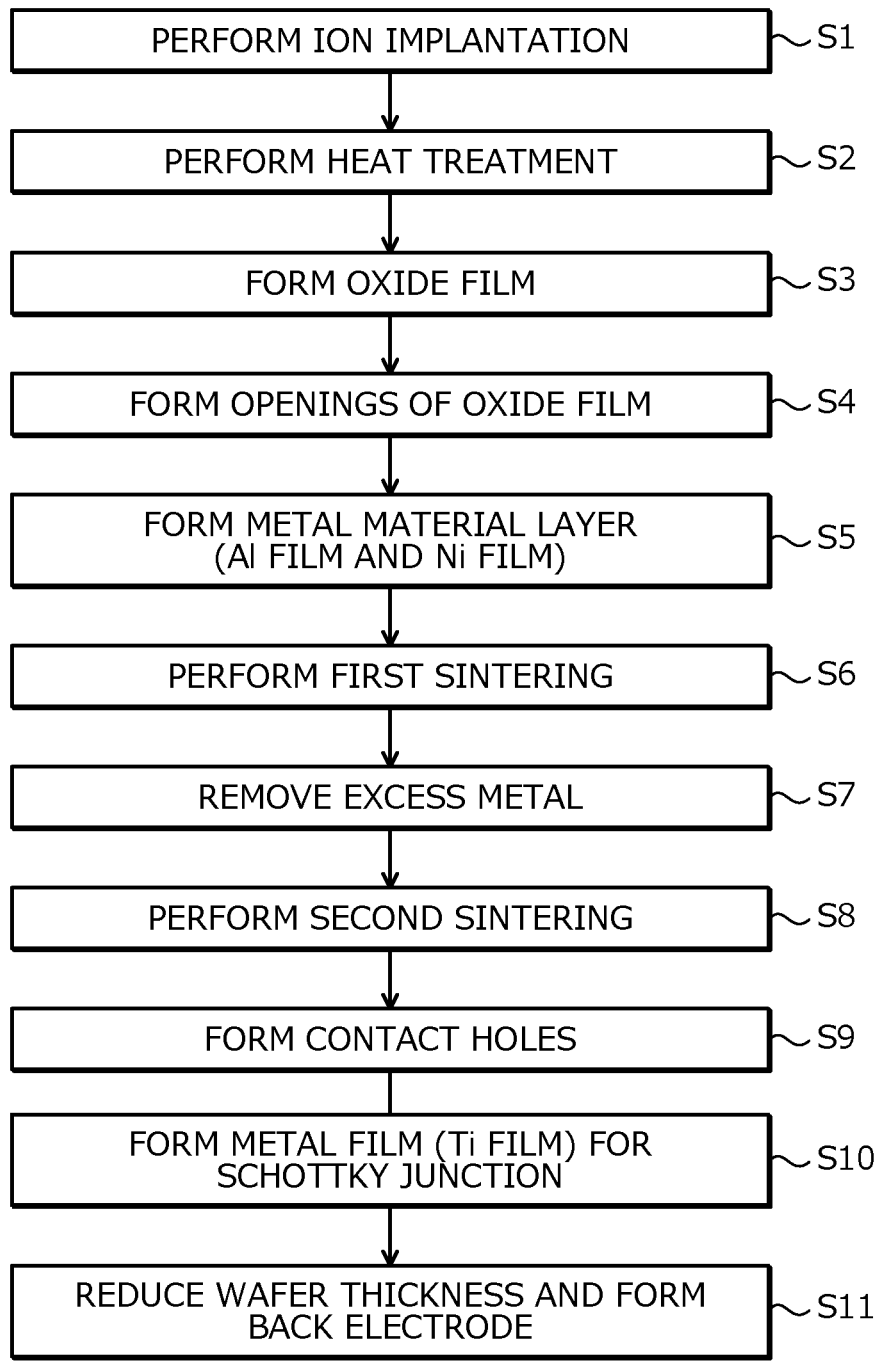
FIG. 4 is a flowchart of an outline of a method of manufacturing the silicon carbide semiconductor device according to the first embodiment.
Figure 16:
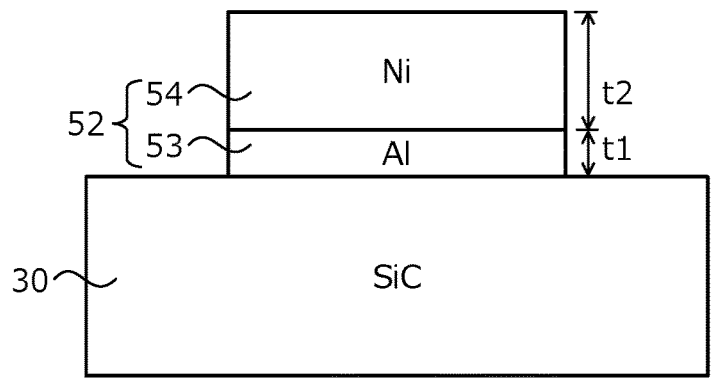
FIG. 16 is a cross-sectional view schematically depicting a state of a front electrode of the silicon carbide semiconductor device according to the first embodiment during manufacture.
Figure 17:
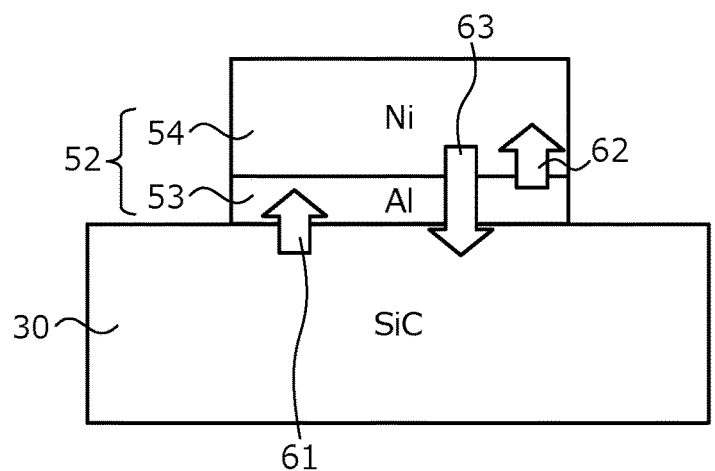
FIG. 17 is a cross-sectional view schematically depicting a state of the front electrode of the silicon carbide semiconductor device according to the first embodiment during manufacture.
Figure 18:
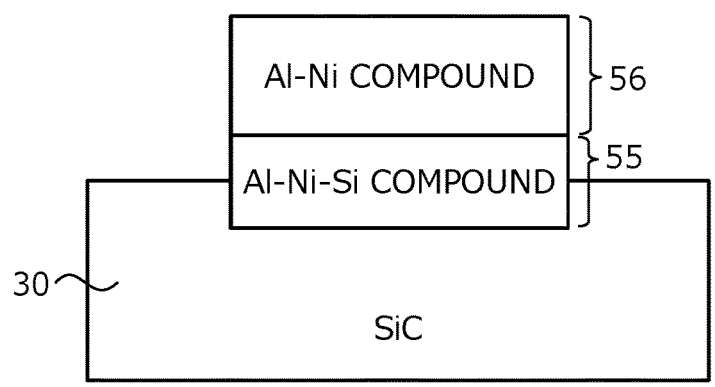
FIG. 18 is a cross-sectional view schematically depicting a state of the front electrode of the silicon carbide semiconductor device according to the first embodiment during manufacture.
Figure 19:
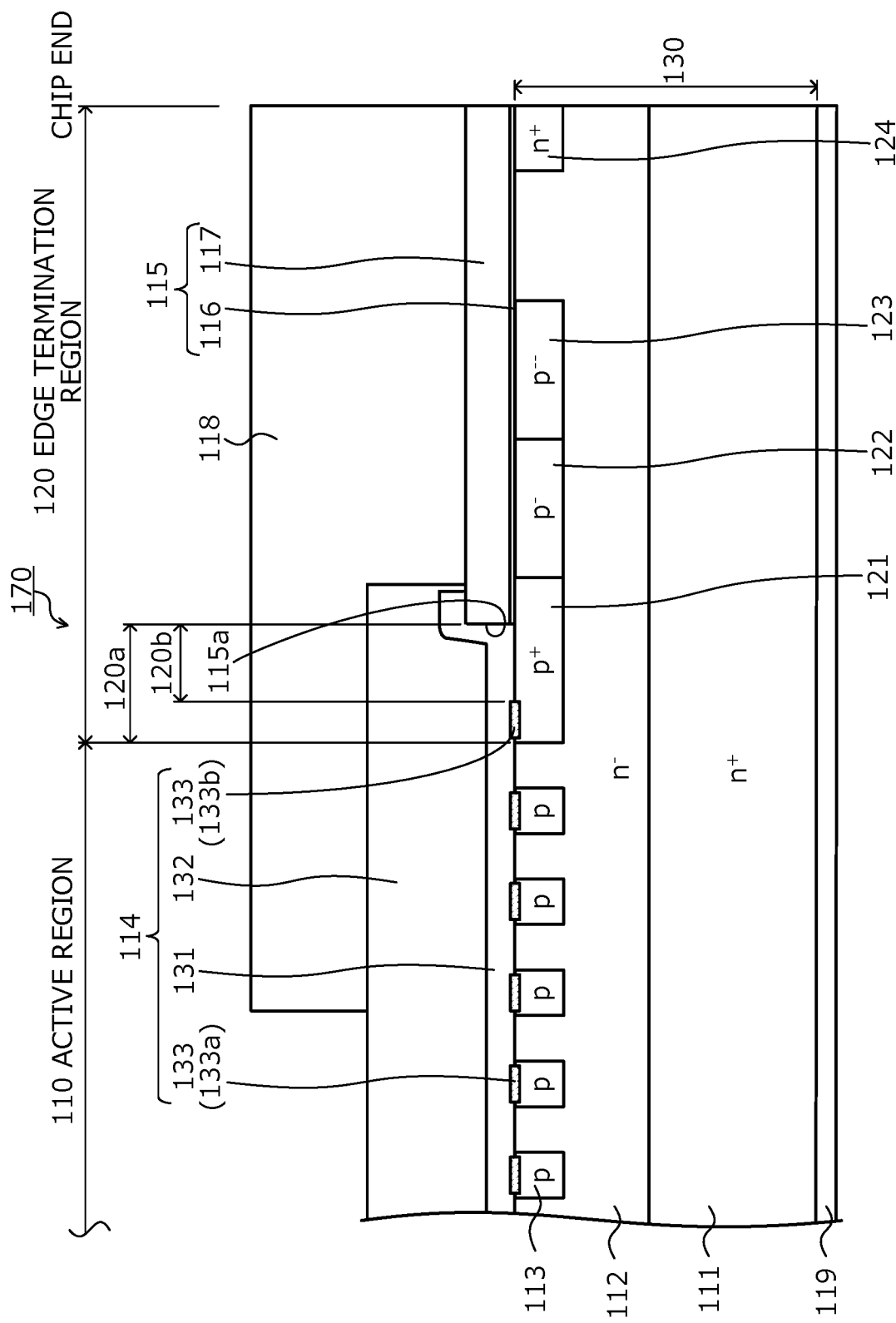
FIG. 19 is a cross-sectional view schematically depicting a state of a front electrode of a first reference example during manufacture.

Next, a method of manufacturing the silicon carbide semiconductor device 40 according to the first embodiment will be described. FIG. 4 is a flowchart of an outline of the method of manufacturing the silicon carbide semiconductor device according to the first embodiment. FIGS. 5, 6, 7, 8, 9, 10, 11, 12, 13, 14, and 15 are cross-sectional views depicting states of the silicon carbide semiconductor device according to the first embodiment during manufacture. FIGS. 16, 17, and 18 are cross-sectional views schematically depicting states of the front electrode of the silicon carbide semiconductor device according to the first embodiment during manufacture. FIG. 19 is a cross-sectional view schematically depicting a state of a front electrode of a first reference example during manufacture.

Figure 5:
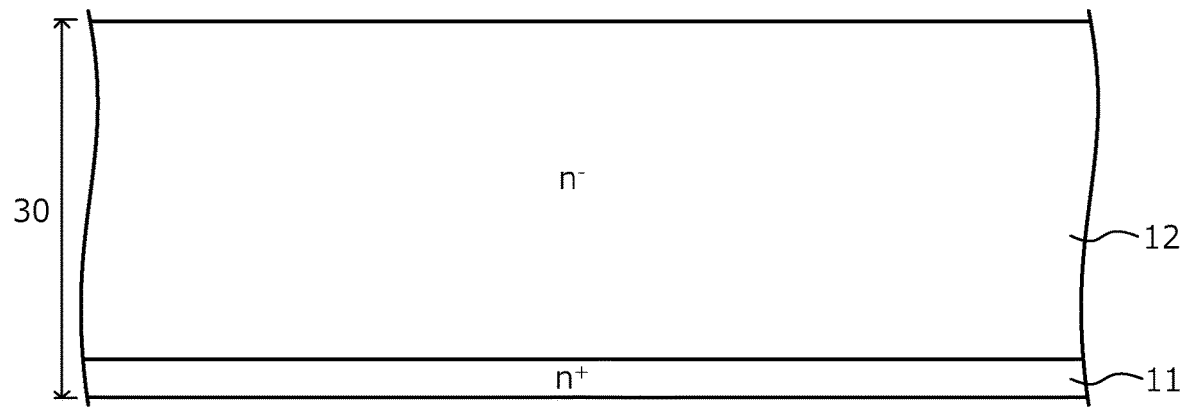
FIG. 5 is a cross-sectional view depicting a state of the silicon carbide semiconductor device according to the first embodiment during manufacture.

First, as depicted in FIG. 5, a 4-layer periodic hexagonal silicon carbide crystal (4H—SiC) substrate doped with, for example, nitrogen (N) of about $1\times10^{16}/cm^3$ is prepared as the $n^+$-type starting substrate (semiconductor wafer) 11. The front surface of the $n^+$-type starting substrate 11, for example, may have an off-angle of about 4 degrees with respect to a (0001) plane. Next, on the front surface of the $n^+$-type starting substrate 11, an $n^-$-type epitaxial layer doped with nitrogen at about, for example, $1.8\times10^{16}/cm^3$, and forming the type drift region 12 is grown (first process).

A thickness of the $n^+$-type starting substrate 11 forming the $n^+$-type cathode region, for example, may be about 350 μm. A thickness of the $n^-$-type epitaxial layer forming the $n^-$-type drift region 12, for example, may be about 6 μm. By the process up to here, the semiconductor substrate (semiconductor wafer) 30 is fabricated in which the $n^-$-type epitaxial layer forming the $n^-$-type drift region 12 is stacked on the front surface of the $n^+$-type starting substrate 11. As described above, regarding the semiconductor substrate 30, the main surface thereof including the $n^-$-type drift region 12 is regarded as the front surface, while the main surface thereof including the $n^+$-type starting substrate 11 is regarded at the back surface.

Figure 6:
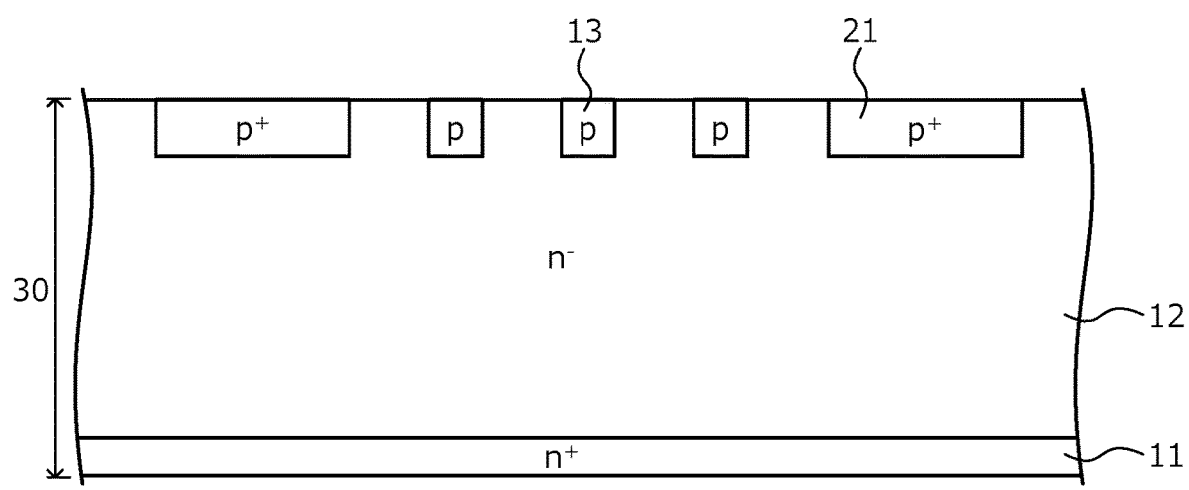
FIG. 6 is a cross-sectional view depicting a state of the silicon carbide semiconductor device according to the first embodiment during manufacture.

Next, as depicted in FIG. 6, by photolithography and a first ion implantation of a p-type impurity such as aluminum, in the active region 10 (refer to FIGS. 1, 3), at least one of the p-type regions 13 configuring the JBS structure, and the FLR 21 are each selectively formed at a surface region of the front surface of the semiconductor substrate 30 (step S1 (part 1): second and third processes). In FIG. 6, the p-type regions 13 are simplified and a fewer number thereof (herein, 3) as compared to FIG. 1 are depicted (similarly in FIGS. 7 to 15). The p-type regions 13 are disposed along a direction parallel to the front surface of the semiconductor substrate 30 at an equal interval of, for example, about 2 μm.

Here, the first ion implantation is performed from the front surface of the semiconductor substrate 30 to the $n^-$-type epitaxial layer (the $n^-$-type drift region 12) while the semiconductor substrate 30 is heated at a temperature of, for example, 500 degrees C. In the first ion implantation, for example, ion implantation of a p-type impurity is divided into plural stages at differing acceleration energies within a range from about 30 keV to 350 keV so that the impurity concentration having a box-profile from the front surface of the semiconductor substrate 30 to a depth of 500 nm becomes about $2\times10^{19}/cm^3$.

Figure 7:
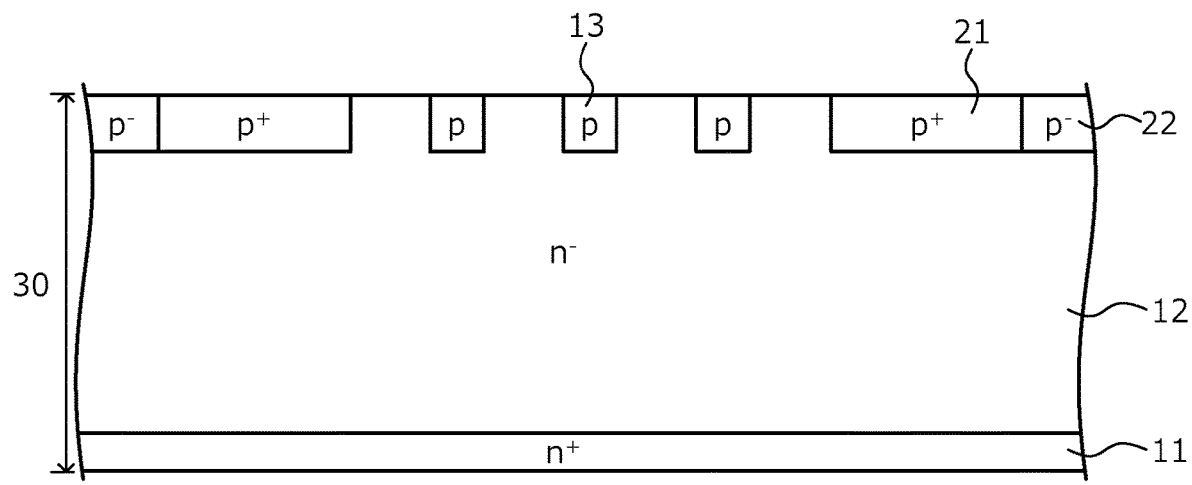
FIG. 7 is a cross-sectional view depicting a state of the silicon carbide semiconductor device according to the first embodiment during manufacture.

Next, as depicted in FIG. 7, by performing repeatedly, under differing conditions, a process including photolithography and a second ion implantation of an impurity as one set, p-type regions (the $p^-$-type region 22 and the $p^{--}$-type region 23) configuring the JTE structure, and the $n^+$-type channel stopper region 24 (refer to FIG. 3) are each selectively formed at surface regions of the front surface of the semiconductor substrate 30, in the edge termination region 20 (refer to FIG. 3) (step S1 (part 2)). The second ion implantation, for example, similarly to the first ion implantation, is separated into plural stages so that the impurity concentration distribution has a box-profile.

Figure 8:
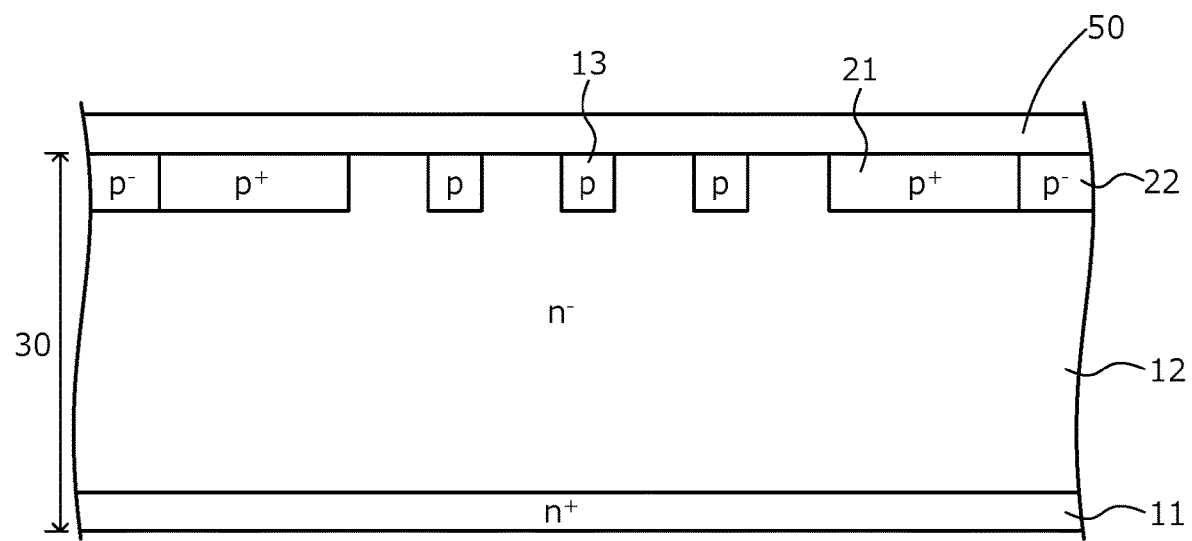
FIG. 8 is a cross-sectional view depicting a state of the silicon carbide semiconductor device according to the first embodiment during manufacture.

Next, as depicted in FIG. 8, after an entire area of the front surface of the semiconductor substrate 30, for example, is covered and protected by a carbon (C) protective film 50, the impurities implanted by the first and the second ion implantations are activated by a heat treatment (step S2). In the process at step S2, for example, after the semiconductor substrate 30 is inserted in a processing furnace of heat treatment equipment and an atmosphere inside the processing furnace is evacuated (vacuumed) to at most about $1\times10^{-2}$ Pa, argon (Ar) gas is introduced into the processing furnace and in an atmosphere of a pressure of about $1\times10^5$ Pa, a heat treatment at a temperature of about 1700 degrees C. is performed for about five minutes.

Figure 9:
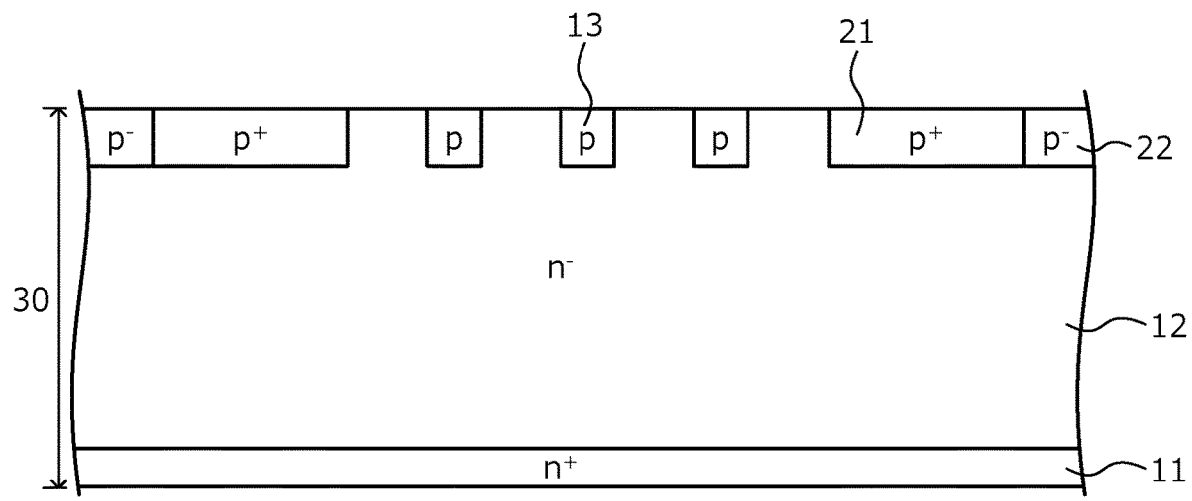
FIG. 9 is a cross-sectional view depicting a state of the silicon carbide semiconductor device according to the first embodiment during manufacture.

Next, as depicted in FIG. 9, for example, by ashing using ashing process (ashing) equipment, the carbon protective film 50 is removed. For example, as the ashing equipment, reactive ion etching (RIE) equipment is used. In a processing furnace of the RIE equipment, after an oxygen ($O_2$) gas atmosphere of a pressure of about 6 Pa is established, high-frequency (radio frequency (RF)) power of about 500 W is applied and by ashing of about five minutes under the plasmatized oxygen gas atmosphere, the carbon protective film 50 is removed.

Figure 10:
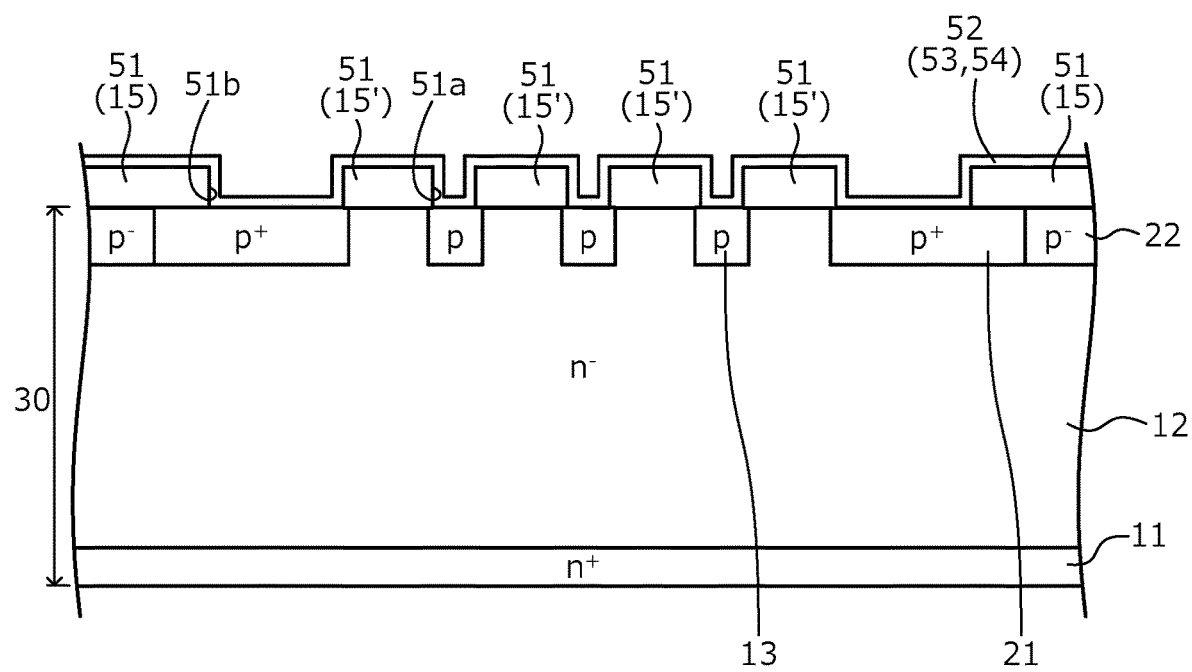
FIG. 10 is a cross-sectional view depicting a state of the silicon carbide semiconductor device according to the first embodiment during manufacture.

Next, as depicted in FIG. 10, an oxide film 51 is formed at an entire area of the front surface of the semiconductor substrate 30 (step S3: fourth process). Next, by photolithography and etching, the oxide film 51 is selectively removed, forming openings (first and second openings) 51a, 51b (step S4: fifth process). In the process at step S4, the plural openings 51a respectively exposing the p-type regions 13, and the one opening 51b exposing a part of the FLR 21 in a substantially rectangular shape surrounding a periphery of the active region 10, are formed in the oxide film 51.

By the process at step S4, of the oxide film 51, a part 15' covering the $n^-$-type drift region 12 in the active region 10 and a part forming the field oxide film 15 in the edge termination region 20 are left. After the process at step S4, all of the oxide film 51 including the part forming the field oxide film 15 is an oxide film mask used in forming the nickel silicide films 33 at a process described hereinafter. Of the oxide film 51, the part 15' covering the $n^-$-type drift region 12 in the active region 10 does not remain in the product.

In other words, in the process at step S4, the field oxide film 15 and the oxide film mask used in forming the nickel silicide films 33 are formed concurrently. Therefore, the oxide film 51 has the same layered structure as that of the field oxide film 15. In particular, the oxide film 51 is a stacked oxide film having a thickness of about 500 nm, in which the thermal oxide film 16 and the deposited oxide film 17 (refer to FIG. 3) are sequentially stacked and formed by, for example, a thermal oxidation method and a chemical vapor deposition (CVD) method.

In the process at step S4, dry etching having high dimensional accuracy may be performed. As a result, the p-type regions 13 and the FLR 21 may be exposed with dimensional accuracy. Further, the outer sidewall of the opening 51b of the oxide film 51 forms a sidewall of the contact hole 15a of the field oxide film 15. Therefore, by performing dry etching in the process at step S4, the contact hole 15a of the field oxide film 15 may be formed with dimensional accuracy.

Next, for example, on the front surface (surface) of the semiconductor substrate 30 in the openings 51a, 51b of the oxide film 51, the metal material film 52 is formed spanning from the oxide film 51 by a sputtering method (step S5: sixth process). The metal material film 52 is a stacked metal film in which an aluminum film (metal film containing aluminum) 53 and a nickel film 54 are sequentially stacked (FIG. 16). In FIG. 10, the aluminum film 53 and the nickel film 54 are depicted collectively as one layer, the metal material film 52.

The nickel film 54 is a cap film that protects the aluminum film 53 from melting during a heat treatment at step S6 described hereinafter and, for example, has a thickness t2 of about 50 nm. The cap film is used because when the cap film is not used, the aluminum film 53 melts due to the heat treatment at step S6, becoming granular and partially in contact with the semiconductor substrate 30. In this case, an Al—Ni—Si compound (compound layer) 55 described hereinafter cannot be formed uniformly, spanning an entire area of the front surface of the semiconductor substrate 30.

Thereafter, by a heat treatment, the metal material film 52 is subject to a first sintering (sintering) (step S6: seventh process), whereby the aluminum-nickel-silicon (Al—Ni—Si) compound 55 is generated in the openings 51a, 51b of the oxide film 51 (refer to FIG. 11). A mechanism by which the Al—Ni—Si compound 55 is generated by this process (first sintering) will be described in detail using FIGS. 16 to 18.

In FIG. 16, only contact parts of the metal material film 52 and of the semiconductor substrate 30 where each is in contact with the other in the openings 51a, 51b of the oxide film 51 are depicted while other parts are not depicted (similarly in FIGS. 17, 18). In FIG. 16, while a state in one of the openings (51a, 51b) of the oxide film 51 is depicted, the state in all the openings 51a, 51b of the oxide film 51 is a same as that depicted in FIG. 16. The aluminum film 53 has a thickness t1, for example, set to be 20 nm and the thickness t2 of the nickel film 54, for example, may be set to be 50 nm.

By the heat treatment at step S6, at the contact parts of the metal material film 52 and of the semiconductor substrate 30 in the openings 51a, 51b of the oxide film 51, silicon atoms in the semiconductor substrate 30 thermally diffuse into the aluminum film 53 (thermal diffusion 61). Aluminum atoms in the aluminum film 53 thermally diffuse into the nickel film 54 (thermal diffusion 62). Nickel atoms in the nickel film 54 thermally diffuse into the aluminum film 53 and the semiconductor substrate 30 (thermal diffusion 63) (FIG. 17).

By the thermal diffusion 62 of the aluminum atoms into the nickel film 54 and the thermal diffusion 63 of the nickel atoms into the aluminum film 53, on the front surface of the semiconductor substrate 30 and at a surface of the oxide film 51 in the openings 51a, 51b of the oxide film 51, an aluminum-nickel (AlNi) compound 56 is generated. Further, by a reaction of the aluminum-nickel compound 56 and the semiconductor substrate 30, at the contact parts of the metal material film 52 and of the semiconductor substrate 30, the Al—Ni—Si compound 55 is generated (FIG. 18).

The Al—Ni—Si compound 55 is generated by a reaction between the metal material film 52 and low-impurity-concentration parts of the p-type regions 13 and the FLR 21 that are diffusion regions formed by ion implantation, the low-impurity-concentration parts being from the front surface of the semiconductor substrate 30 to positions at a depth of about 20 nm to 30 nm and having a low impurity concentration. Therefore, a compound layer including the Al—Ni—Si compound 55 is formed by self-alignment using the oxide film 51 as a mask so as to cut into the semiconductor substrate 30 in the depth direction, in the openings 51a, 51b of the oxide film 51.

Further, the Al—Ni—Si compound 55 is in contact with a part of each of the p-type regions 13 at which the Al—Ni—Si compound 55 is formed or a part of the FLR 21 at which the Al—Ni—Si compound 55 is formed, the part with which the Al—Ni—Si compound 55 is in contact has an impurity concentration higher than that of the low-impurity-concentration parts and is positioned at a depth deeper from the front surface of the semiconductor substrate 30 than are the low-impurity-concentration parts. The Al—Ni—Si compound 55 forms low-resistance ohmic contacts with the high impurity concentration in the p-type regions 13 or the FLR 21.

In the Al—Ni—Si compound 55, by a silicide reaction between the Al—Ni—Si compound 55 and the semiconductor substrate 30, leftover carbon (C) (hereinafter, excess carbon) in the semiconductor substrate 30 may be deposited to an extent that no layering occurs. The excess carbon is carbon atoms leftover in the semiconductor substrate 30 after consumption by the silicide reaction with the silicon atoms in the semiconductor substrate 30. In particular, the excess carbon may be deposited granularly and distributed in the Al—Ni—Si compound 55.

A period of the heat treatment at step S6, for example, may be at least two minutes with consideration of chemical reaction uniformity and may be, for example, at most about one hour with consideration of product mass production. A temperature of the heat treatment at step S6, for example, may be in a range from about 400 degrees C. to 550 degrees C. A reason for this is as follows. When the temperature of the heat treatment at step S6 exceeds 550 degrees C., the aluminum atoms in the aluminum film 53 enter and react with the oxide film 51 that is a silicon oxide ($SiO_2$) film, whereby a product is generated in the oxide film 51 as described hereinafter. When this product is left in the field oxide film 15, the product causes leak defects during reverse bias.

When the temperature of the heat treatment at step S6 is less than 400 degrees C., the above reaction between the semiconductor substrate 30 and the metal material film 52 does not occur, the metal material film 52 is not used, and by a subsequent process at step S7, the metal material film 52 is removed entirely. Further, when the temperature of the heat treatment at step S6 is less than 600 degrees C., the aluminum atoms in the aluminum film 53 are not thermally diffused into the semiconductor substrate 30. The heat treatment at step S6, for example, may be performed by a heat treatment furnace for which uniform temperature management is simple. A uniform temperature means a substantially same temperature within a range that includes an allowable error due to process variation. The above is a detailed description related to the first sintering.

Next, as depicted in FIG. 12, excess metal (excess part) on the oxide film 51 and in the openings 51a, 51b of the oxide film 51 is removed (step S7: eighth process). The excess metal is metal generated from the metal material film 52, excluding that of the nickel silicide films 33 and in particular, the aluminum-nickel compound 56 that did not contribute to the generation of the nickel silicide films 33. In the process at step S7, for example, by wet etching using phosphorus nitric acid, an entire area of the front surface of the semiconductor substrate 30 is etched. By the process at step S7, the Al—Ni—Si compound 55 is left in each of the openings 51a, 51b of the oxide film 51.

Figure 13:
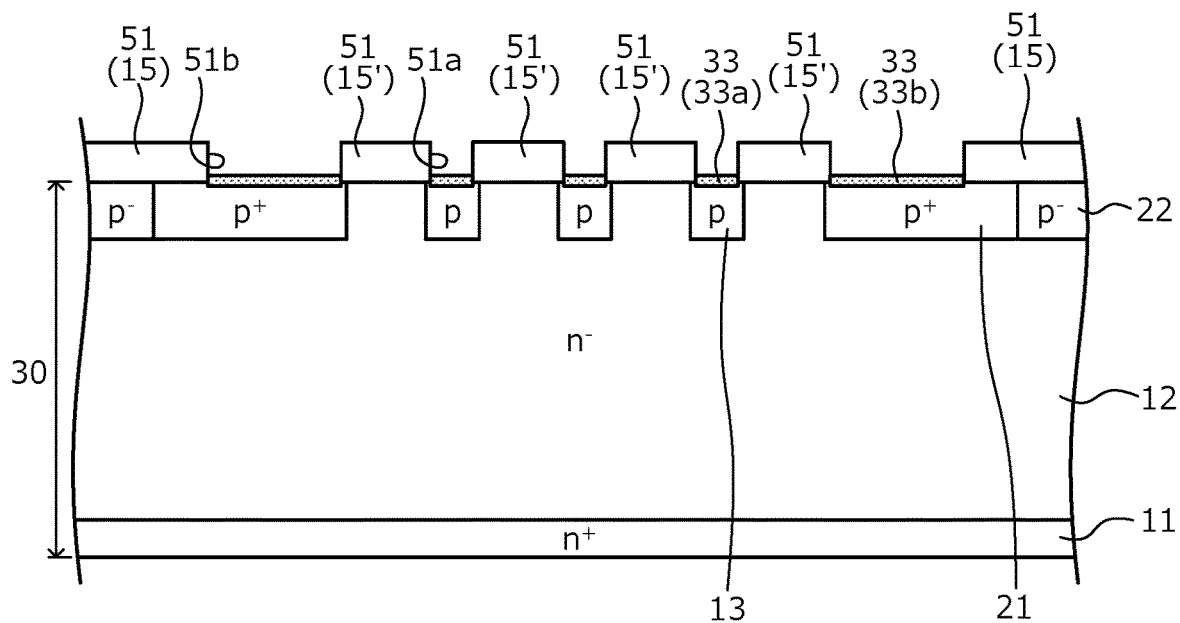
FIG. 13 is a cross-sectional view depicting a state of the silicon carbide semiconductor device according to the first embodiment during manufacture.

Next, as depicted in FIG. 13, the Al—Ni—Si compound 55 is subject to a second sintering by a heat treatment (step S8: ninth process). By the heat treatment at step S8, nickel silicide is generated in the Al—Ni—Si compound 55, and the Al—Ni—Si compound 55 is set as the nickel silicide films 33 that forms an ohmic contact with the semiconductor substrate 30. As a result, in the openings 51a, 51b of the oxide film 51, the nickel silicide films 33 that form an ohmic contact with the semiconductor substrate 30 are formed, respectively, by self-alignment using the oxide film 51 as a mask.

A period of the heat treatment at step S8, for example, may be equal to the period of the heat treatment at step S6. A temperature of the heat treatment at step S8 may be in a range from at least, for example, about 900 degrees C. to generate the nickel silicide in the Al—Ni—Si compound 55 to about, for example, at most 1050 degrees C. capable of low cost processing using a vertical heat treatment furnace. The process at step S8, for example, may be performed using a heat treatment furnace capable of uniform management of the temperature of the heat treatment.

Figure 14:
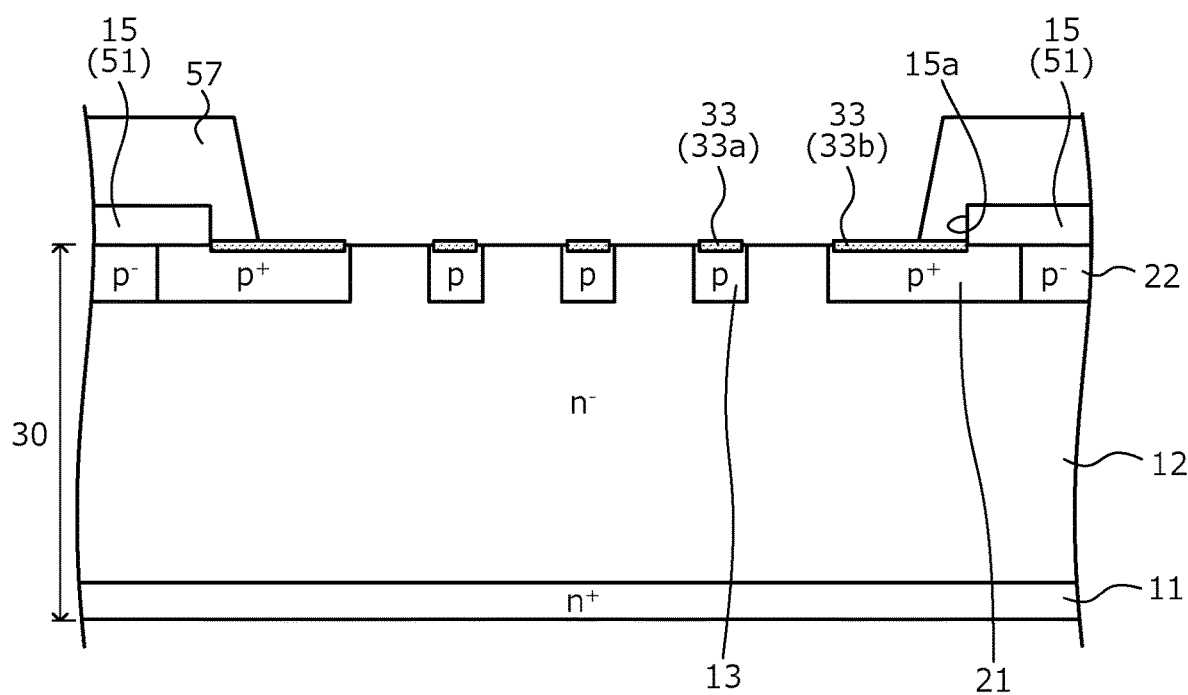
FIG. 14 is a cross-sectional view depicting a state of the silicon carbide semiconductor device according to the first embodiment during manufacture.

Next, as depicted in FIG. 14, a resist film 57 opened at a formation region of the contact hole 15a of the field oxide film 15 (refer to FIG. 3) is formed by photolithography. Next, etching is performed using the resist film 57 as a mask, thereby forming the contact hole 15a (refer to FIG. 3) that penetrates through the field oxide film 15 in the depth direction (step S9: tenth process). In the process at step S9, of the oxide film 51, only a part that forms the field oxide film 15 is left.

In the process at step S9, of the oxide film 51, in the active region 10, the part 15' covering the n$^-$-type drift region 12 is entirely removed and by connecting all of the openings 51a, 51b of the oxide film 51, the contact hole 15a already formed in the process at step S4 appears. During the process at step S9, the outer sidewall of the opening 51b of the oxide film 51 is completely covered by the resist film 57 and therefore, this sidewall of the opening 51b of the oxide film 51 is not etched.

An entire area of the active region 10 and an entire area of a surface of the connecting region 20a of the edge termination region 20 are exposed in the contact hole 15a of the field oxide film 15. As a result, in the contact hole 15a of the field oxide film 15, all the nickel silicide films 33 (33a, 33b) and parts of the n$^-$-type drift region 12 between adjacent nickel silicide films 33 are exposed.

When the widths w2a, w2b of the first and the second nickel silicide films 33a, 33b are each less than the width w1 of the p-type regions 13 and less than the width w3 of the connecting region 20a of the edge termination region 20, parts of the surfaces of the p-type regions 13 and of the FLR 21, the parts not bonded to the nickel silicide films 33 are further exposed in the contact hole 15a of the field oxide film 15.

The process at step S9 may be performed by wet etching. When the process at step S9 is performed by dry etching, plasma damage due to dry etching may remain at the front surface of the semiconductor substrate 30. Even when the process at step S9 is performed by wet etching, the contact hole 15a may be formed in the field oxide film 15 with dimensional accuracy. A reason for this is that during the process at step S4, the outer sidewall of the opening 51b formed with dimensional accuracy by dry etching in the oxide film 51 is configured by the sidewall of the contact hole 15a of the field oxide film 15.

In the process at step S4, of the oxide film 51, the part 15' covering the n$^-$-type drift region 12 and the part forming the field oxide film 15 are left (refer to FIG. 10). Therefore, after the process at step S4, of the oxide film 51, the part 15' covering the n$^-$-type drift region 12 is left in the contact hole 15a of the field oxide film 15 and the outer sidewall of the opening 51b of the oxide film 51 configures the sidewall of the contact hole 15a of the field oxide film 15. The outer sidewall of the opening 51b of the oxide film 51 is completely covered by the resist film 57 during the process at step S9 and is not etched. Therefore, in the process at step S4 and thereafter, the position of the outer sidewall of the opening 51b of the oxide film 51 does not change.

In this manner, dimensional accuracy of the contact hole 15a of the field oxide film 15 is a same as the dimensional accuracy of the opening 51b of the oxide film 51 formed by dry etching and is not dependent on the dimensional accuracy of the wet etching in the process at step S9. Further, in the process at step S4 and thereafter, the position of the outer sidewall of the opening 51b of the oxide film 51 does not change, whereby the second nickel silicide film 33b that is formed by self-alignment using the oxide film 51 as a mask is maintained in a state of being in contact with the outer sidewall of the opening 51b of the oxide film 51 even after the process at step S9. In other words, the second nickel silicide film 33b is maintained in the state of being in contact with the field oxide film 15 at the sidewall of the contact hole 15a even after the process at step S9.

For example, a conventional silicon carbide semiconductor device 170 depicted in FIG. 19 is fabricated by applying a conventional technique (for example, Japanese Laid-Open Patent Publication No. 2008-282972). The conventional silicon carbide semiconductor device 170 depicted in FIG. 19 is a silicon carbide diode (hereinafter, the first reference example) that differs from the silicon carbide semiconductor device 40 according to the first embodiment in that a second nickel silicide film 133b is disposed. Configuration of the first reference example other than the second nickel silicide film 133b is similar to that of the silicon carbide semiconductor device 40 according to the first embodiment. In FIG. 19, parts of the first reference example are assigned reference numerals that are the reference numerals of corresponding parts of the silicon carbide semiconductor device 40 according to the first embodiment to which 100 is added.

In the first reference example, the second nickel silicide film 133b that is in ohmic contact with a FLR 121 has to be disposed at a position separate from the field oxide film 115. A reason for this is as follows. In the first reference example, the metal material film 172 (refer to FIGS. 30A, 30B, 31A, and 31B) is patterned and is selectively left on the p-type regions 113 and on the FLR 121, after which the metal material film 172 is sintered, thereby forming a nickel silicide film 133. In this case, when the second nickel silicide film 133b is in contact with the field oxide film 115, aluminum atoms from inside an aluminum film of the metal material film 172 enter and react with the field oxide film 115, whereby a product that is a source of leak current (corresponds to reference numeral 134 in FIGS. 30A, 30B, 31A, and 31B) is generated.

The second nickel silicide film 133b is disposed separate from the field oxide film 115 so that the product is not generated. Nonetheless, in a case in which the second nickel silicide film 133b is disposed separate from the field oxide film 115, when the second nickel silicide film 133b is formed, a process margin for forming the second nickel silicide film 133b at a position separate from the field oxide film 115 is taken, whereby a non-operating region 120b occurs in which no ohmic contact and no Schottky junction are formed. Therefore, corresponding to a mathematical surface area of the non-operating region 120b, a sufficient ohmic contact area cannot be established by a connecting region 120a of an edge termination region 120.

On the other hand, in the first embodiment, as described above, the first and the second nickel silicide films 33a, 33b may be formed by self-alignment using the oxide film 51 as a mask. Therefore, the first and the second nickel silicide films 33a, 33b may be respectively formed accurately at substantially an entire surface of surface regions of the p-type regions 13 and of the FLR 21. Further, the second nickel silicide film 33b may be disposed at substantially an entire area of the connecting region 20a of the edge termination region 20 so as to be in contact with the field oxide film 15 and in the connecting region 20a of the edge termination region 20, a sufficient ohmic contact area may be established.

Figure 15:
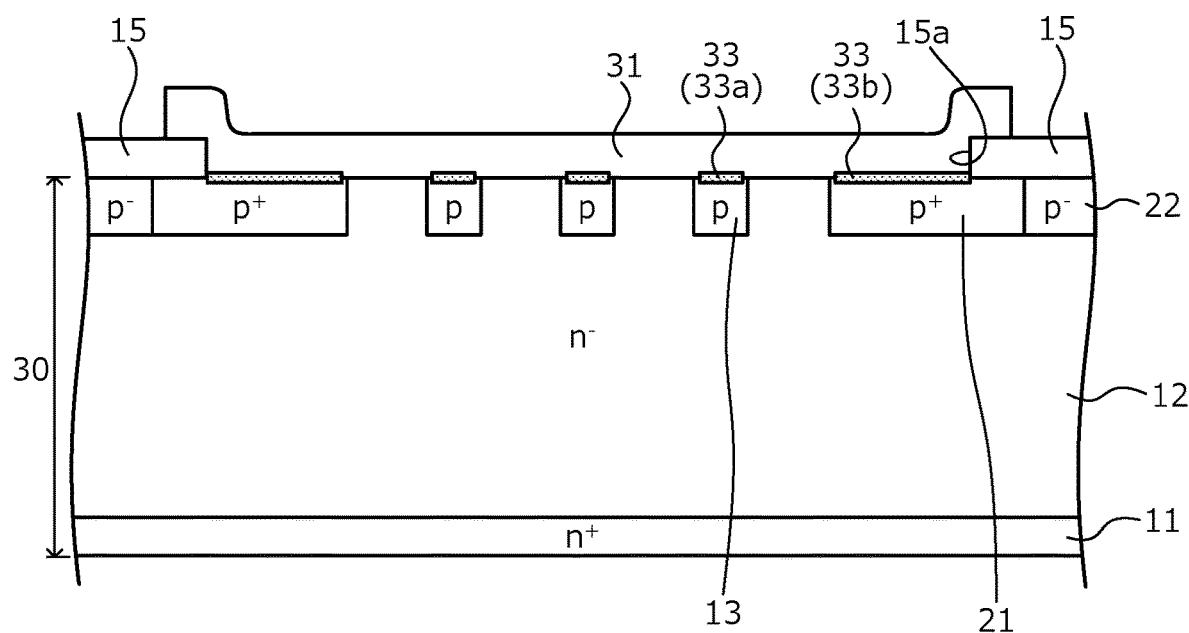
FIG. 15 is a cross-sectional view depicting a state of the silicon carbide semiconductor device according to the first embodiment during manufacture.

Next, as depicted in FIG. 15, for example, by a physical vapor deposition (PVD) such as sputtering, the titanium film 31 is formed from the surface of the field oxide film 15, to an entire area of the front surface of the semiconductor substrate 30 in the contact hole 15a. Next, by photolithography and etching, the titanium film 31 is left only in the contact hole 15a (step S10: eleventh process). The titanium film 31 has a thickness that, for example, may be about 100 nm. The titanium film 31 may extend on the field oxide film 15, from inside the contact hole 15.

Next, for example, the titanium film 31 is sintered by a heat treatment for about ten minutes at a temperature of about 500 degrees C. By the heat treatment, a Schottky junction between the titanium film 31 and the $n^-$-type drift region 12 is formed. Next, for example, by a physical vapor deposition such as sputtering, an aluminum alloy film having a thickness of, for example, about 5 μm is formed from a surface of the titanium film 31, to an entire area of the surface of the field oxide film 15. Next, by photolithography and etching, the aluminum alloy film is removed, leaving that at the surface of the titanium film 31, as the aluminum alloy film 32 that forms the front electrode 14.

Next, after the front surface of the semiconductor substrate 30 (semiconductor wafer) is covered and protected by a protective film (not depicted), the semiconductor substrate 30 is ground from a back side thereof, whereby the semiconductor substrate 30 is thinned to a product thickness. Next, for example, after nickel and/or titanium is deposited at an entire area of the back surface of the semiconductor substrate 30 (the back surface of the $n^+$-type starting substrate 11) by a physical vapor deposition such as sputtering, laser annealing is performed, whereby the back electrode 19 is formed (step S11: twelfth process). Thereafter, after the protective film at the front surface of the semiconductor substrate 30 is removed, the semiconductor substrate 30 is diced (cut) into individual chips, whereby the silicon carbide semiconductor device 40 depicted in FIGS. 1 and 3 is completed.

As described above, according to the first embodiment, at substantially an entire area of the connecting region of the edge termination region, the second nickel silicide film that forms an ohmic electrode in ohmic contact with the FLR is provided, whereby a low-resistance ohmic electrode may be formed at an entire area of the connecting region of the edge termination region, not only in the active region. Therefore, a predetermined mathematical surface area of the Schottky junction between the $n^-$-type drift region and the Schottky electrode is maintained, low forward voltage (Vf) is maintained, and by the total junction area of the ohmic contacts in the active region and the connecting region of the edge termination region, an ohmic contact area necessary for obtaining a predetermined surge current tolerance may be established. Therefore, even when the chip size is reduced, without degradation of forward voltage characteristics, a sufficiently large ohmic contact area is established, enabling a predetermined surge current tolerance to be realized.

Next, a method of manufacturing a silicon carbide semiconductor device according to a second embodiment will be described. The method of manufacturing the silicon carbide semiconductor device according to the second embodiment differs from the method of manufacturing the silicon carbide semiconductor device 40 according to the first embodiment in that instead of the aluminum film 53 (refer to FIG. 16) of the metal material film 52 used in forming the first and the second nickel silicide films 33a, 33b, an aluminum-silicon (AlSi) film is used. In other words, in the second embodiment, in forming the first and the second nickel silicide films 33a, 33b, the metal material film 52 is used in which the aluminum-silicon film and the nickel film 54 are sequentially stacked.

The aluminum-silicon film of the metal material film 52 has a thickness that, for example, may be in a range from about 5 nm to 300 nm. When the thickness of the aluminum-silicon film of the metal material film 52 is less than 5 nm, the thickness of the aluminum-silicon film of the metal material film 52 is too thin, whereby a predetermined contact resistance cannot be obtained even when subsequent processes are performed. When the thickness of the aluminum-silicon film of the metal material film 52 exceeds 300 nm, the thickness of the aluminum-silicon film of the metal material film 52 is too thick, whereby the nickel film of the metal material film 52 and the semiconductor substrate 30 do not react and thus, the nickel silicide films 33 are not formed and the predetermined contact resistance cannot be obtained.

The aluminum-silicon film of the metal material film 52 has a silicon concentration that, for example, may be in a range from about 0.1 wt % to 3 wt %. By setting the silicon concentration of the aluminum-silicon film of the metal material film 52 to be at least 0.1 wt %, a silicide reaction between the nickel atoms in the nickel film 54 of the metal material film 52 and the silicon atoms in the aluminum-silicon film of the metal material film 52 progresses more easily than does the silicide reaction between nickel atoms in the nickel film 54 of the metal material film 52 and the silicon atoms in the semiconductor substrate 30. As a result, excess carbon in the semiconductor substrate 30 does not easily occur and the nickel silicide films 33 may be formed in a state having less deposited excess carbon from the semiconductor substrate 30 as compared to the first embodiment, or a state having no deposited excess carbon from the semiconductor substrate 30.

When the silicon concentration of the aluminum-silicon film of the metal material film 52 exceeds 3 wt %, silicon cannot be distributed uniformly in the aluminum-silicon film when the aluminum-silicon film is formed by sputtering and parts where the silicon is locally high occur in the aluminum-silicon film. In this case, a ratio of the silicon in the aluminum-silicon film of the metal material film 52 cannot be set to a predetermined ratio across an entire area in the aluminum-silicon film. The silicon concentration of the aluminum-silicon film of the metal material film 52 is optimized within the suitable range above, for example, with the respective thicknesses of the aluminum-silicon film of the metal material film 52 and the nickel film 54 as standards.

The method of manufacturing the silicon carbide semiconductor device according to the second embodiment further differs from the method of manufacturing the silicon carbide semiconductor device 40 according to the first embodiment (refer to the flowchart in FIG. 4) in the following to points. A first difference is that in the process at step S5, as described above the metal material film 52 in which the aluminum-silicon film and the nickel film 54 are sequentially stacked is used. A second difference is that the temperature of the heat treatment at step S6 may be set higher than that in the method of manufacturing the silicon carbide semiconductor device 40 according to the first embodiment above.

The second difference will be described. In the second embodiment, similarly to the first embodiment, by the heat treatment at step S6, the aluminum-silicon film and the nickel film 54 are caused to react and generate the aluminum-nickel compound 56, and the aluminum-nickel compound 56 and the semiconductor substrate 30 are further caused to react and generate the Al—Ni—Si compound 55 (refer to FIG. 18). The temperature of the heat treatment at step S6, for example, may be in a range from about 400 degrees C. to 800 degrees C. and an upper limit value may be set higher than the temperature of the same heat treatment in the first embodiment.

In the second embodiment, an ability to perform the process at step S6 at a temperature higher than an upper limit temperature of the same heat treatment in the first embodiment step S6 makes a reaction between the aluminum-silicon film of the metal material film 52 and the oxide film 51 that is an oxide film mask (refer to FIG. 10) more difficult to occur even when the heat treatment is performed at a temperature higher than the upper limit temperature of the same heat treatment in the first embodiment. The higher the temperature is at which the process at step S6 is performed, the lower may be the resistance of the ohmic contacts between the nickel silicide films 33 and the semiconductor substrate 30 (the p-type regions 13).

A reason for setting the upper limit value of the temperature of the heat treatment at step S6 to about 800 degrees C. is that when the temperature of the heat treatment at step S6 exceeds 800 degrees C., the aluminum-nickel compound 56 and the oxide film 51 react, thereby generating a product (corresponds to reference numeral 134 in FIGS. 30A, 30B, 31A, and 31B) that is a source of leak current in the oxide film 51. This product cannot be removed by the wet etching in the subsequent process at step S7 and therefore, remains in the product. A reason for setting a lower limit temperature of the heat treatment at step S6 to about 400 degrees C. is a same as that in the first embodiment.

Further, during the heat treatment at step S6, silicon atoms from the aluminum-silicon film of the metal material film 52 are supplied and supply of the silicon atoms in the semiconductor substrate 30 is difficult and deposition of excess carbon from the semiconductor substrate 30 is difficult. While the excess carbon reacts with the aluminum atoms in the aluminum-nickel compound 56, thereby generating, in the aluminum-nickel compound 56, aluminum carbide ($Al_4C_3$), which increases the contact resistance with the semiconductor substrate 30, deposition of the excess carbon is difficult, whereby generation aluminum carbide is difficult and increases in the contact resistance may be suppressed.

Further, the deposition of the excess carbon is impeded in the nickel silicide films 33, thereby enabling improvement of the adhesiveness between the nickel silicide films 33 and the semiconductor substrate 30 and suppression of peeling of the front electrode 14. Further, during formation of the nickel silicide films 33, silicon atoms are supplied from the aluminum-silicon film of the metal material film 52, thereby enabling reduction of the consumption of the silicon carbide in the semiconductor substrate 30 and a shallow setting of the ion implantation depth of the p-type regions 13 that configure the JBS structure.

Other than having the nickel silicide films 33 in a state of having less deposition of excess carbon from the semiconductor substrate 30 as compared to the first embodiment or in state of having no deposited excess carbon from the semiconductor substrate 30, the structure of the silicon carbide semiconductor device according to the second embodiment is similar to that of the silicon carbide semiconductor device 40 according to the first embodiment (refer to FIGS. 1 to 3).

As described above, according to the second embodiment, effects similar to those of the first embodiment may be obtained. Further, according to the second embodiment, the temperature of the heat treatment of the first sintering for forming the nickel silicide film that is the ohmic electrode may be set higher, enabling formation of ohmic contacts that have even lower resistance. Further, according to the second embodiment, contact resistance between the nickel silicide film that is the ohmic electrode and the semiconductor substrate may be reduced. Further, according to the second embodiment, peeling of the front electrode may be suppressed from a border between the ohmic electrode and semiconductor substrate.

Figure 20:
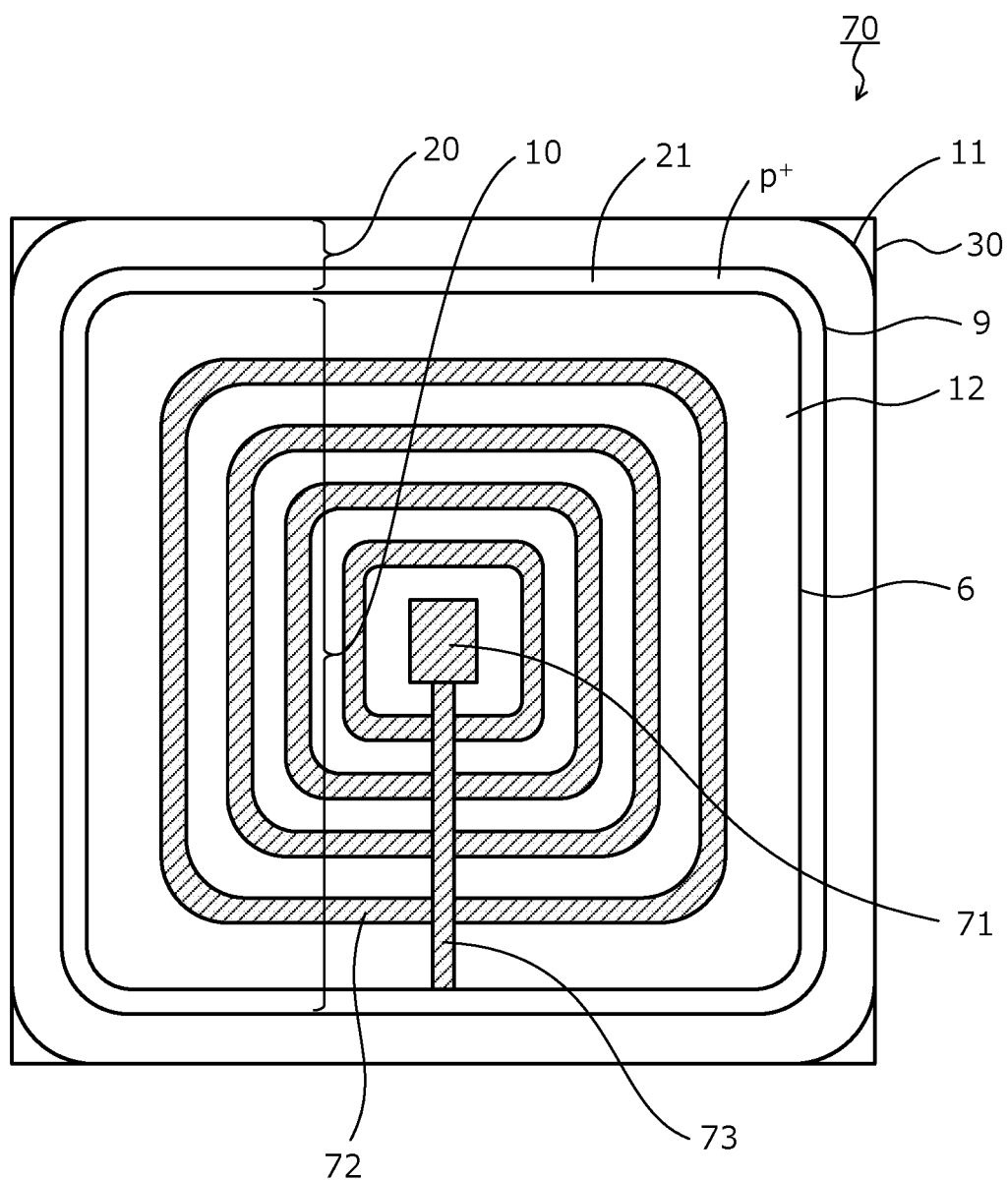
FIG. 20 is a plan view depicting an example of a layout of a silicon carbide semiconductor device according to a third embodiment when viewed from the front side of the semiconductor substrate.
Figure 21:
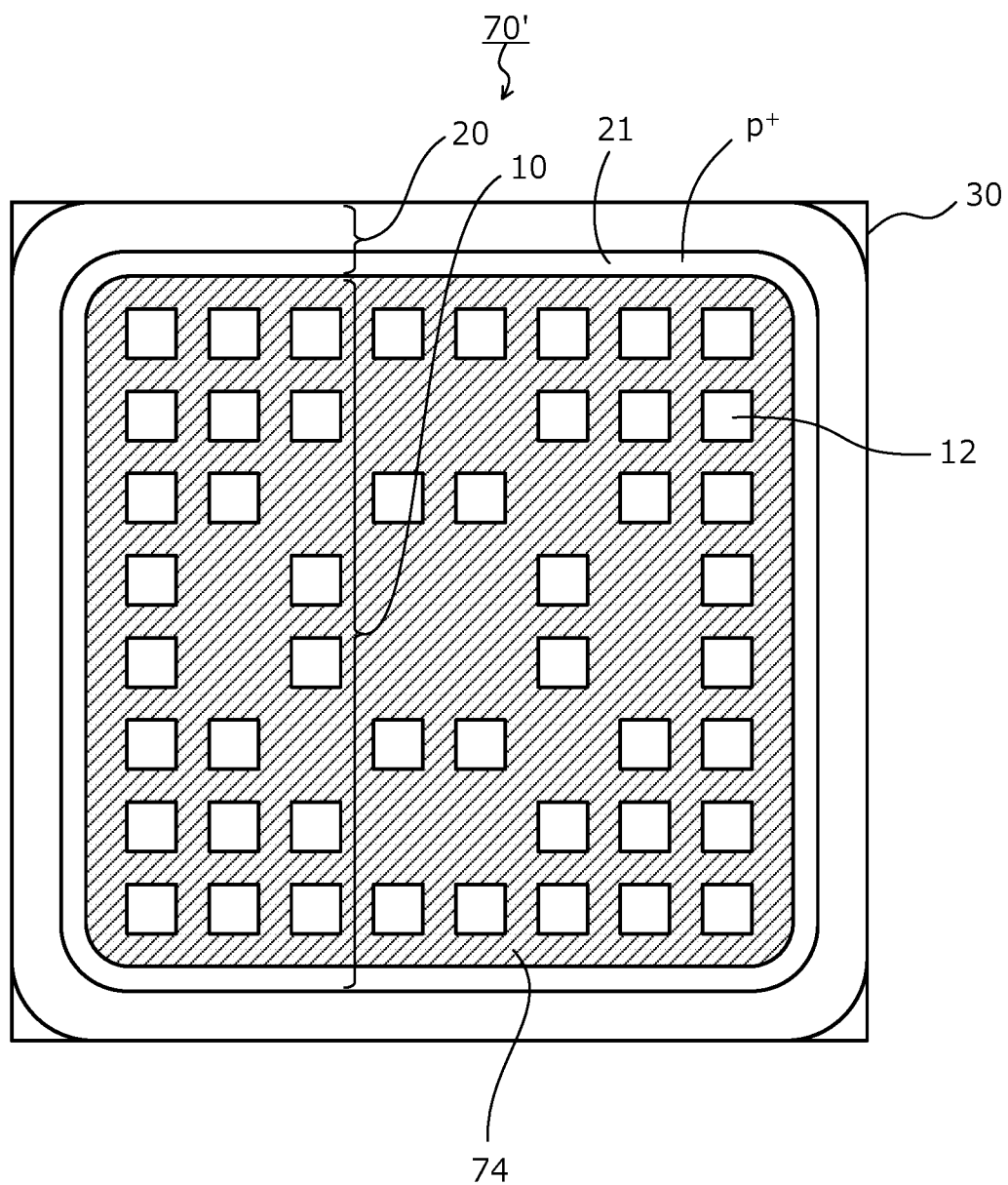
FIG. 21 is a plan view depicting an example of a layout of the silicon carbide semiconductor device according to the third embodiment when viewed from the front side of the semiconductor substrate.

Next, a structure of a silicon carbide semiconductor device according to a third embodiment will be described. FIGS. 20 and 21 are plan views depicting examples of layouts of the silicon carbide semiconductor device according to the third embodiment when viewed from the front side of the semiconductor substrate.

Silicon carbide semiconductor devices 70, 70' according to the third embodiment, when viewed from the front side of the semiconductor substrate (semiconductor chip) 30, have layouts of p-type regions 72, 74 configuring the JBS structure, the layouts differing from that of the silicon carbide semiconductor device 40 according to the first embodiment (refer to FIGS. 1 to 3). In the third embodiment, similarly to the first embodiment, the first and the second nickel silicide films (not depicted, correspond to reference characters 33a, 33b in FIG. 3) that respectively form ohmic contacts with the p-type regions 72, 74 and the FLR 21 are provided as a lowermost layer of the front electrode (not depicted, corresponds to reference numeral 14 in FIG. 3).

Therefore, while not depicted, a layout of the first nickel silicide films that form an ohmic contacts with the p-type regions 72, 74 is a same as the layout of the p-type regions 72, 74. In the third embodiment, in the p-type regions 72, 74, a junction area with the first nickel silicide film is greatest directly beneath a bonding part between the front electrode and a wire (not depicted, corresponds to reference numeral 42 in FIG. 2), and with increasing distance of the disposal position from the bonding part of the front electrode and the wire, the junction area with the first nickel silicide film decreases.

In particular, in the silicon carbide semiconductor device 70 according to the third embodiment depicted in FIG. 20, for example, directly beneath the bonding part (center of the active region 10) of the front electrode and the wire, a p-type region 71 is disposed in a substantially rectangular shape. The p-type regions 72 configuring the JBS structure are disposed in a circular concentric pattern around the center of the active region 10 and have a substantially rectangular planar shape surrounding a periphery of the p-type region 71. All the p-type regions 72, for example, are electrically connected by a p-type region 73 that extends in a linear shape from the p-type region 71 to the FLR 21, along a direction parallel to the front surface of the semiconductor substrate 30.

Between the front surface of the semiconductor substrate 30 and the titanium film (not depicted, corresponds to reference numeral 31 in FIG. 3) of the front electrode, similarly to the first embodiment, the first nickel silicide film (not depicted, corresponds to reference character 33a in FIG. 3) that forms ohmic contacts with the p-type regions 71 to 73 is disposed in a same planar shape and a same layout as those of the p-type regions 71 to 73. Ohmic contact areas of the first nickel silicide film and each of the p-type regions 71 to 73 are substantially equal to the surface areas of the p-type regions 71 to 73, respectively. The n$^-$-type drift region 12 between the p-type regions 71 to 73, similarly to the first embodiment, forms Schottky junctions with the titanium film of the front electrode.

In the silicon carbide semiconductor device 70' according to the third embodiment and depicted in FIG. 21, parts of the n$^-$-type drift region 12, in the active region 10, for example, are exposed at the front surface of the semiconductor substrate 30, in mutually separate, substantially rectangular shapes. The parts (hereinafter, exposed parts of the n$^-$-type drift region 12) of the n$^-$-type drift region 12, exposed at the front surface of the semiconductor substrate 30 are not disposed directly beneath the bonding part of the bonding pad and the wire. The exposed parts of the n$^-$-type drift region 12 are disposed more densely with increasing distance from the bonding part of the bonding pad and the wire. The exposed parts of the n$^-$-type drift region 12, similarly to the first embodiment, form Schottky junctions with the titanium film of the front electrode.

The p-type region 74 configuring the JBS structure is disposed at an entire area of the front surface of the semiconductor substrate 30 in the active region 10, so as to surround peripheries of the exposed parts of the n$^-$-type drift region 12. An outer periphery of the p-type region 74 may be in contact with the FLR 21. Between the front surface of the semiconductor substrate 30 and the titanium film (not depicted, corresponds to reference numeral 31 in FIG. 3) of the front electrode, similarly to the first embodiment, the first nickel silicide film (not depicted, corresponds to reference character 33a in FIG. 3) that forms an ohmic contact with the p-type region 74 is disposed in a substantially same planar shape and a substantially same layout as those of the p-type region 74. An ohmic contact area the first nickel silicide film and the p-type region 74 is substantially equal to the surface area of the p-type region 74.

A method of manufacturing the silicon carbide semiconductor devices 70, 70' according to the third embodiment is a same as the method of manufacturing the silicon carbide semiconductor device 40 according to the first embodiment (refer to FIGS. 4 to 18); however, the layout of the p-type regions 72, 74 that configure the JBS structure is modified. The method of manufacturing the silicon carbide semiconductor devices 70, 70' according to the third embodiment may be a same as the method of manufacturing the silicon carbide semiconductor device according to the second embodiment.

As described above, according to the third embodiment, effects similar to those of the first embodiment may be obtained. Further, in general, a current density is greatest directly beneath the bonding part of the bonding pad and the wire, and generated heat tends to increase. According to the third embodiment, the first nickel silicide film (ohmic electrode) is disposed directly beneath the bonding part of the bonding pad and the wire, whereby ohmic contact area directly beneath the bonding part of the bonding pad and the wire increases. As a result, the surge current tolerance at a part where the current density is greatest may be increased and the surge current tolerance of the semiconductor chip overall may be improved.

Further, according to the third embodiment, with increasing proximity to an outer periphery of the semiconductor substrate, the ohmic contact area decreases. Therefore, even when the ohmic contact area directly beneath the bonding part of the bonding pad and the wire is increased and the surge current tolerance is improved, Schottky junction surface area of the semiconductor chip overall may be maintained and the forward voltage of the semiconductor chip overall may be maintained. Therefore, in the silicon carbide diode having the JBS structure in which pn junctions and Schottky junctions are present at a front side of the semiconductor substrate, a predetermined low forward voltage is maintained and the surge current tolerance may be improved.

Figure 22:
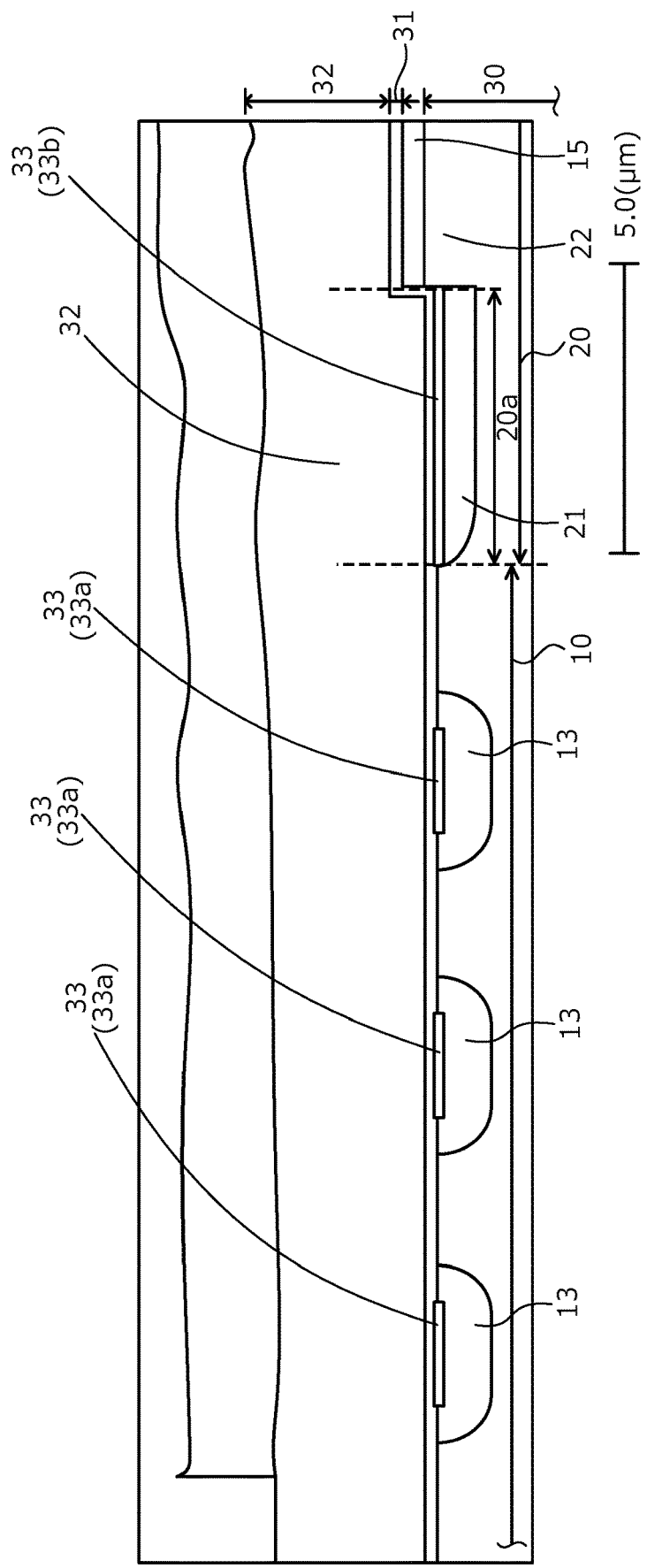
FIG. 22 is a cross-sectional view schematically depicting a state of a vicinity of the ohmic contacts of a first example.

The ohmic contact area of the silicon carbide semiconductor device 40 according to the first embodiment (refer to FIG. 3) was verified. FIG. 22 is a cross-sectional view schematically depicting a state of a vicinity of the ohmic contacts of a first example. FIG. 22 depicts a state of the first and the second nickel silicide films 33a, 33b of a lowermost layer of the front electrode 14 of the first example, observed using scanning electron microscope (SEM).

Figure 23:
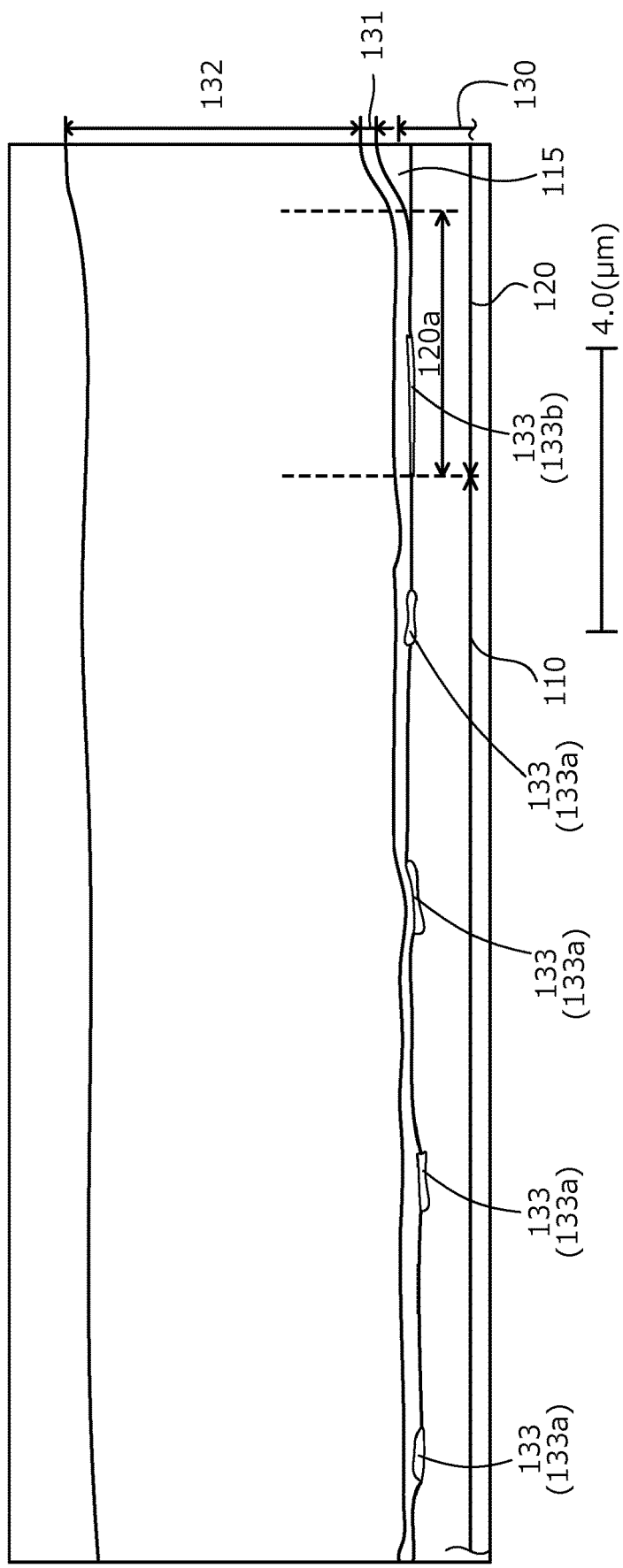
FIG. 23 is a cross-sectional view schematically depicting an observed state of a vicinity of ohmic contacts of a first reference example.
Figure 24:
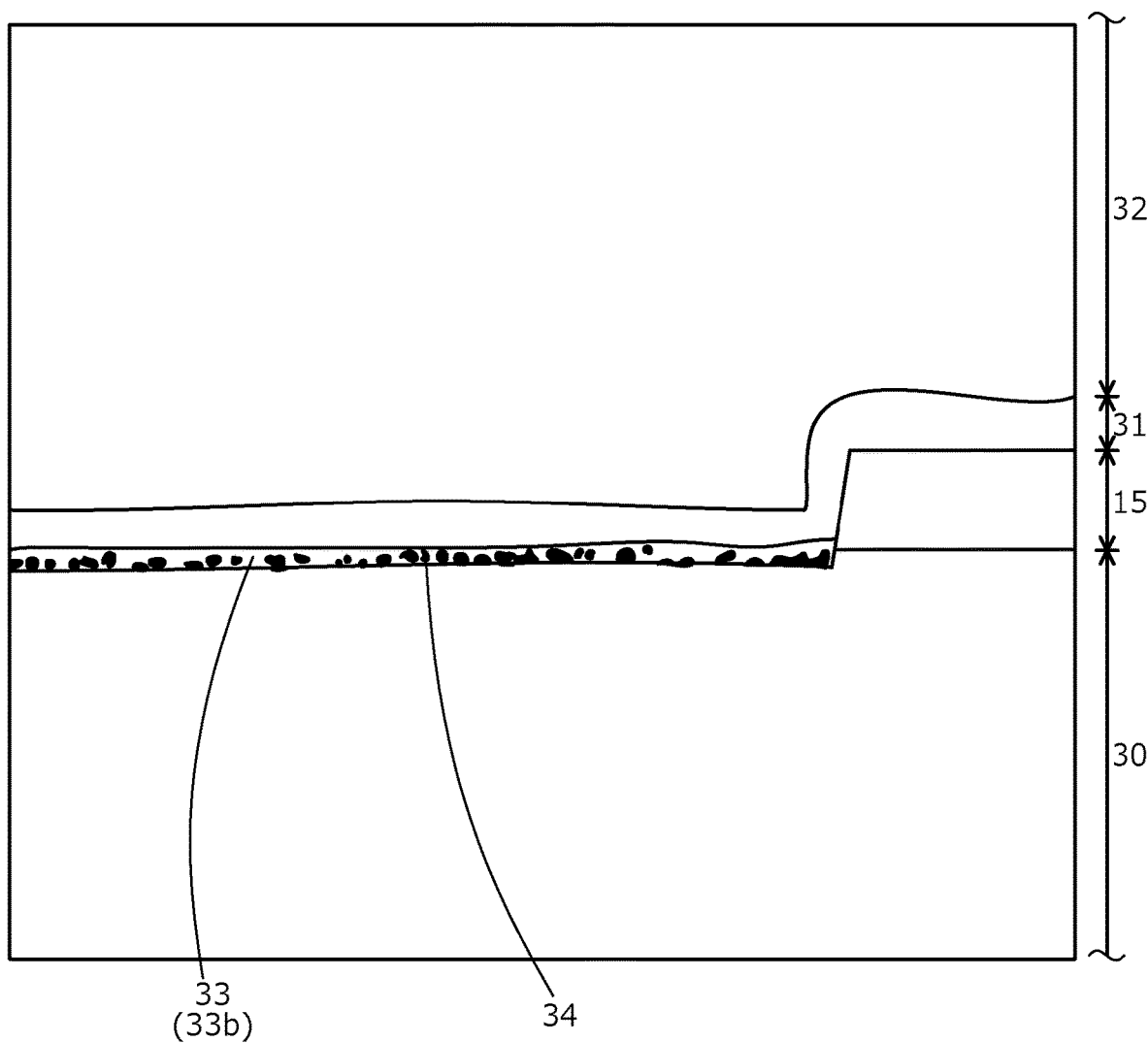
FIG. 24 is an enlarged cross-sectional view of a part of FIG. 22.

FIG. 23 is a cross-sectional view schematically depicting an observed state of a vicinity of the ohmic contacts of the first reference example. FIG. 23 depicts a state of the first and the second nickel silicide films 133a, 133b of the lowermost layer of the front electrode 114 of the first reference example (the conventional silicon carbide semiconductor device 170, refer to FIG. 19) described above, observed using the scanning electron microscope. FIG. 24 is an enlarged cross-sectional view of a part of FIG. 22. FIG. 24 depicts the second nickel silicide film 33b of the first example.

From the results depicted in FIG. 23, it was confirmed that in the first reference example in which the conventional technique was applied, the second nickel silicide film 133b is formed apart from the field oxide film 115, whereby the product that is a source of leak current in the field oxide film 115 was not generated.

On the other hand, from the results depicted in FIG. 22, in a silicon carbide diode (hereinafter, the first example) fabricated according to the method of manufacturing the silicon carbide semiconductor device 40 according to the first embodiment described above, the second nickel silicide film 33b of the lowermost layer of the front electrode 14 may be formed so as to be in contact with the field oxide film 15 and substantially an entire area of the connecting region 20a of the edge termination region 20 is in ohmic contact with the FLR 21.

Further, in the first example, it was confirmed that at contact parts of the second nickel silicide film 33b and of the field oxide film 15, the product (reference numeral 134 in FIGS. 30A, 30B, 31A, and 31B) that is a source of leak current was not generated in the field oxide film 15. Therefore, it was confirmed that an amount of leak current about equal to that of the first reference example is maintained and the ohmic contact area could be established to a greater extent than in the first reference example.

Further, from the results depicted in FIGS. 22 and 24, in the first example, it was confirmed that excess carbon 34 generated in the semiconductor substrate 30 by the silicide reaction between the semiconductor substrate 30 and the nickel film 54 is deposited in the nickel silicide films 33 and granularly distributed. It was confirmed that even when the excess carbon 34 is deposited in the nickel silicide films 3, provided the deposition is not layered, decreases in the adhesiveness between the nickel silicide films 33 and the semiconductor substrate 30 may be suppressed.

Figure 25:
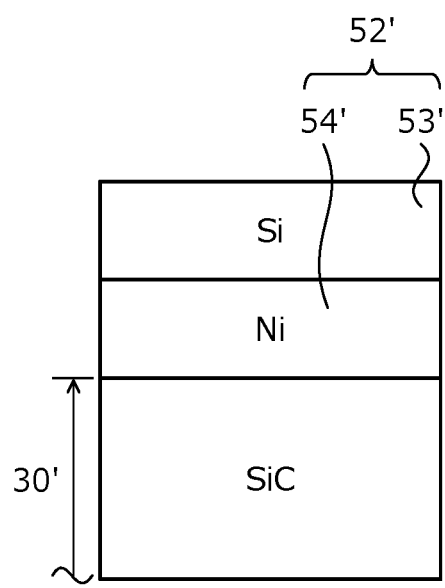
FIG. 25 is a cross-sectional view schematically depicting a state of a front electrode of a second reference example during manufacture.
Figure 26:
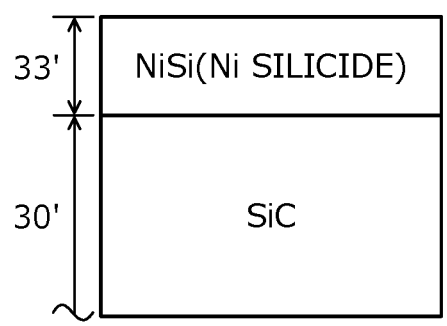
FIG. 26 is a cross-sectional view schematically depicting a state of the front electrode of the second reference example during manufacture.

The excess carbon 34 generated by the silicide reaction between the semiconductor substrate 30 and the nickel film 54, and deposited in the nickel silicide films 33 was verified. FIGS. 25 and 26 are cross-sectional views schematically depicting a state of a front electrode of a second reference example during manufacture. In FIGS. 25 and 26, contact parts of a semiconductor substrate 30' containing silicon carbide and of a metal material film 52' are depicted while parts formed in the semiconductor substrate 30' before the formation of the metal material film 52' are not depicted.

As depicted in FIG. 25, at the front surface of the semiconductor substrate 30', the nickel film 54' and a silicon film 53' are sequentially stacked, thereby forming the metal material film 52'. Further, as depicted in FIG. 26, the metal material film 52' and the semiconductor substrate 30' react, thereby forming a silicide, whereby the nickel silicide films 33' in ohmic contact with the p-type regions (not depicted) configuring the JBS structure are formed.

Figure 27:
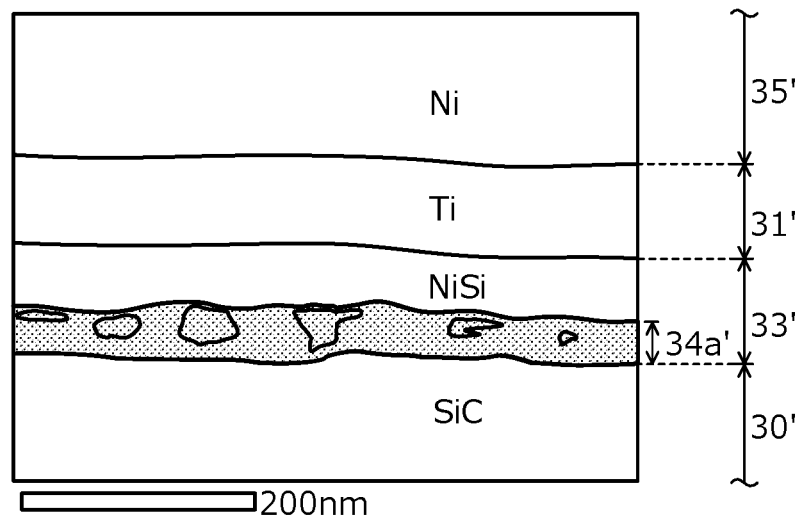
FIG. 27 is a cross-sectional view schematically depicting an observed state of a structure of the front electrode of the second reference example.
Figure 28:
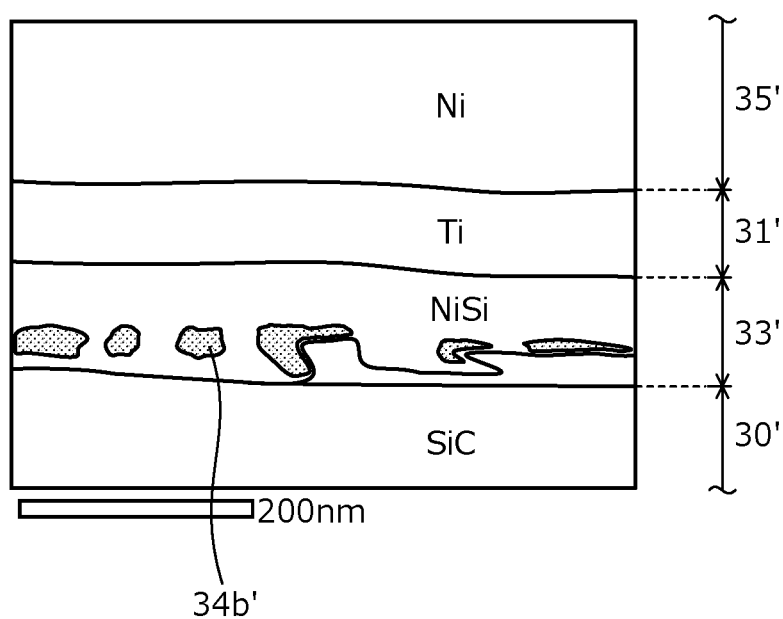
FIG. 28 is a cross-sectional view schematically depicting an observed state of the structure of the front electrode of the second reference example.

By the method described above, the metal material film 52' in which the silicon concentration of the silicon film 53' differs is used and two silicon carbide diodes (hereinafter, the second reference example) are fabricated. A structure of the second reference example is a same as that of the first reference example excluding the different layered structure of the front electrode. States of the two front electrodes of the second reference example as observed using a scanning electron microscope are depicted in FIGS. 27 and 28. FIGS. 27 and 28 are cross-sectional views schematically depicting observed states of the structure of the front electrode of the second reference example. Reference numerals 31' and 35' are, respectively, a titanium film and a nickel film that are sequentially stacked on the nickel silicide films 33' after formation of the nickel silicide films 33'.

In the second reference example, the nickel silicide films 33' formed so that the silicon concentration of the silicon film 53' of the metal material film 52' is less than 1 wt % are depicted in FIG. 27. The nickel silicide films 33' formed with the silicon concentration of the silicon film 53' of the metal material film 52' being set at 1 wt %, which is within the suitable range of the silicon concentration of the aluminum-silicon film of the metal material film 52 used in the method of manufacturing the silicon carbide semiconductor device according to the second embodiment described above are depicted in FIG. 28.

As depicted in FIG. 27, it was confirmed that when the silicon concentration of the silicon film 53' of the metal material film 52' is set to be less than 1 wt %, the silicide reaction between the semiconductor substrate 30' and the nickel film 54' progresses, whereby the excess carbon 34a' (hatched part) leftover in the semiconductor substrate 30' is deposited as a layer in the nickel silicide films 33'. Due to the excess carbon 34a' that is in a layer, the adhesiveness between the nickel silicide films 33' and the semiconductor substrate 30' decreases.

On the other hand, as depicted in FIG. 28, it was confirmed that by setting the silicon concentration of the silicon film 53' of the metal material film 52' to be 1 wt %, the excess carbon 34b' (hatched part) leftover in the semiconductor substrate 30' is deposited granularly in the nickel silicide films 33' and does not form a layer. As a result, it was confirmed that by optimizing the silicon concentration of the silicon film 53' of the metal material film 52', formation of the nickel silicide films 33' to be free of the excess carbon 34b' is possible.

In particular, while not depicted, the inventors confirmed that within the suitable range of the silicon concentration of the aluminum-silicon film of the metal material film 52, the suitable range used in the method of manufacturing the silicon carbide semiconductor device according to the second embodiment described above, as depicted in FIG. 28, the excess carbon 34b' in the nickel silicide films 33' may be in a state of being distributed granularly or excess carbon may not be deposited in the nickel silicide films 33'.

Figure 29:
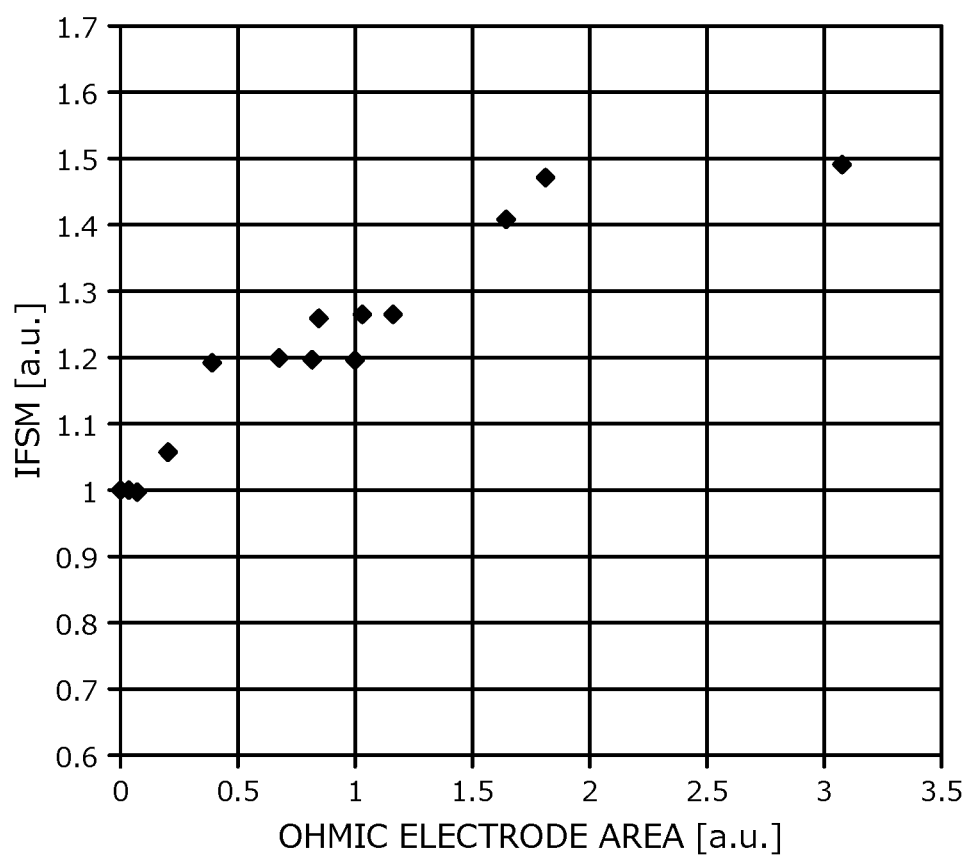
FIG. 29 is a characteristics diagram of a relationship between an ohmic contact area and surge current tolerance of second examples.

Surge current tolerance (IFSM) of the silicon carbide semiconductor device 40 according to the first embodiment was verified. FIG. 29 is a characteristics diagram of a relationship between the ohmic contact area and surge current tolerance of second examples. In FIG. 29, a horizontal axis is the mathematical area (hereinafter, ohmic electrode area) of the second nickel silicide film 33b. In FIG. 29, the ohmic electrode area indicated along the horizontal axis is large, which means that the width w2b of the second nickel silicide film 33b is wide. In FIG. 29, a vertical axis is the surge current tolerance.

Plural silicon carbide diodes (hereinafter, the second examples) were fabricated according to the method of manufacturing the silicon carbide semiconductor device 40 according to the first embodiment described above, for which the width w2b of the second nickel silicide film 33b was variously changed. Surge current tolerance was measured for the second examples. A relationship of the ohmic contact area and the surge current tolerance of the second examples is depicted in FIG. 29.

From the results depicted in FIG. 29, it was confirmed that as the ohmic electrode area is increased, the surge current tolerance may be increased. It was found that irrespective of the layout of the p-type regions 13 configuring the JBS structure, by increasing the ohmic contact area, the surge current tolerance may be increased and therefore, in the second and third embodiment embodiments, effects similar to those of the second example may be obtained.

In the foregoing, without limitation to the embodiments described above, the present invention may be variously changed within a range not departing from the spirit of the present invention and is applicable to silicon carbide semiconductor devices that include an ohmic electrode in ohmic contact with p-type regions disposed in a predetermined pattern.

In particular, for example, the present invention is useful for silicon carbide semiconductor devices that are configured to reduce the contact resistance between a p-type region (or $p^+$-type contact region disposed between the p-type region and a main surface of the semiconductor substrate) and an ohmic electrode, and silicon carbide semiconductor devices having a structure in which an oxide film and an ohmic electrode in ohmic contact with a p-type region are in contact with each other.

Further, for example, in a metal oxide semiconductor field effect transistor ((MOSFET) having an insulated gate of a 3-layered structure including a metal, an oxide film, and a semiconductor) having a built-in SBD on a single semiconductor substrate, the present invention is applicable to a configuration at the front side of the semiconductor substrate.

Further, in a reverse-conducting insulated gate bipolar transistor (RC-IGBT) having a structure in which an insulated gate bipolar transistor (IGBT) and a free wheeling diode (FWD) connected in antiparallel to the IGBT are built into and integrated on a single semiconductor chip, application is possible to a part at which a p-type collector region of a back side of the semiconductor substrate is formed. In an IGBT, application is possible to an entire area of the back surface of the semiconductor substrate.

The silicon carbide semiconductor device and the method of manufacturing a silicon carbide semiconductor device according to the present invention achieve an effect in that in a silicon carbide diode having a JBS structure in which both Schottky junctions and pn junctions are present, a low-resistance ohmic electrode may be formed in not only the active region but also at an entire area of a connecting region of the edge termination region, whereby low forward voltage by the SBD structure is maintained and the surge current tolerance may be improved.

As described above, the silicon carbide semiconductor device and the method of manufacturing a silicon carbide semiconductor device according to the present invention are useful for power semiconductor devices used in power converting equipment and in power supply devices such those of various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device that includes an active region, and a termination region that includes a connecting region surrounding a periphery of the active region, the method comprising:
   providing a semiconductor substrate having a first main surface and a second main surface, the semiconductor substrate containing silicon carbide, and including a first-conductivity-type region of which a main surface is the first main surface of the semiconductor substrate, the first-conductivity-type region having a first region in the active region and a second region spanning an entire area of the connecting region;
   selectively forming a plurality of first second-conductivity-type regions in the first region of the first-conductivity-type region at the first main surface of the semiconductor substrate;
   forming a second second-conductivity-type region in the second region of the first-conductivity-type region at the first main surface of the semiconductor substrate;
   forming an oxide film at the first main surface of the semiconductor substrate, to cover the first-conductivity-type region, the plurality of first second-conductivity-type regions, and the second second-conductivity-type region;
   selectively removing the oxide film, to thereby form a plurality of first openings that expose the plurality of first second-conductivity-type regions, and form a second opening that exposes the second second-conductivity-type region in the connecting region;
   sequentially forming and stacking a metal film containing aluminum and a nickel film in the plurality of first openings and the second opening, to thereby form a metal material film;
   generating a compound layer in the plurality of first openings and the second opening of the oxide film, through self-alignment using the oxide film as a mask, the compound layer being generated by a first heat treatment causing the metal material film and the semiconductor substrate to react with each other;
   removing an excess part of the metal material film after generating the compound layer, the excess part excluding the compound layer;
   forming a nickel silicide film in ohmic contact with the semiconductor substrate, by generating nickel silicide in the compound layer through a second heat treatment after removing the excess part, the second heat treatment being performed at a temperature higher than a temperature of the first heat treatment;
   forming a contact hole that connects the plurality of first openings and the second opening with one another, the contact hole being formed by removing parts of the oxide film in the active region, after forming the nickel silicide film;
   forming, in the contact hole, a first electrode in which
      a titanium film that is in contact with the first-conductivity-type region and forms a Schottky junction with the first-conductivity-type region, and
      a metal electrode film that contains aluminum are sequentially stacked; and
   forming a second electrode at the second main surface of the semiconductor substrate.

2. The method according to claim 1, wherein the plurality of first openings and the second opening are formed by selectively removing the oxide film by dry etching.

3. The method according to claim 1, wherein the metal film is an aluminum film.

4. The method according to claim 3, wherein the temperature of the first heat treatment is in a range from 400 degrees C. to 550 degrees C.

5. The method according to claim 1, wherein the metal film is an aluminum-silicon film.

6. The method according to claim 5, wherein the temperature of the first heat treatment is in a range from 400 degrees C. to 800 degrees C.

7. The method according to claim 5, wherein the aluminum-silicon film has a thickness in a range from 5 nm to 300 nm.

8. The method according to claim 5, wherein the aluminum-silicon film has a silicon concentration in a range from 0.1 wt % to 3 wt %.

9. The method according to claim 1, wherein the temperature of the second heat treatment is in a range from 900 degrees C. to 1050 degrees C.

10. The method according to claim 1, wherein forming the contact hole includes:
    forming a resist mask that covers an outer peripheral part of the oxide film, from one of sidewalls of the second opening that is furthest from the active region, and
    removing the parts of the oxide film in the active region through wet etching using the resist mask as a mask.

11. A silicon carbide semiconductor device having an active region and a termination region that includes a connecting region surrounding a periphery of the active region, the silicon carbide semiconductor device comprising:
    a semiconductor substrate having a first main surface and a second main surface, the semiconductor substrate containing silicon carbide, and including a first-conductivity-type region of which a main surface is the first main surface of the semiconductor substrate;
    a plurality of first second-conductivity-type regions selectively provided in the first-conductivity-type region in the active region, at the first main surface of the semiconductor substrate, the plurality of first secondconductivity-type regions being in contact with the first-conductivity-type region;

a second second-conductivity-type region provided in the first-conductivity-type region to have an entire area of the connecting region, at the first main surface of the semiconductor substrate, the second second-conductivity-type region being in contact with the first-conductivity-type region;

an oxide film provided on the first main surface of the semiconductor substrate in the termination region, the oxide film having an inner end that faces the active region, the connecting region being between the active region and the oxide film;

a first silicide film in ohmic contact with the plurality of first second-conductivity-type regions;

a second silicide film in contact with the inner end of the oxide film and in ohmic contact with the second second-conductivity-type region;

a first electrode in which a titanium film and a metal electrode film containing aluminum are stacked sequentially on the first main surface of the semiconductor substrate, the titanium film being in contact with and forming a Schottky junction with the first-conductivity-type region, and being in contact with and connected to the first silicide film and the second silicide film; and a second electrode provided at the second main surface of the semiconductor substrate.

12. The silicon carbide semiconductor device according to claim 11, wherein
the first silicide film contains nickel, silicon, and aluminum.

13. The silicon carbide semiconductor device according to claim 12, wherein
the first silicide film contains carbon.

14. The silicon carbide semiconductor device according to claim 11, wherein
the second silicide film contains nickel, silicon, and aluminum.

15. The silicon carbide semiconductor device according to claim 14, wherein
the second silicide film contains carbon.

* * * * *